(12) United States Patent
Kao et al.

(10) Patent No.: US 11,393,913 B2
(45) Date of Patent: Jul. 19, 2022

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Wan-Yi Kao, Baoshan Township (TW); Hung Cheng Lin, Hsinchu (TW); Che-Hao Chang, Hsinchu (TW); Yung-Cheng Lu, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/072,719

(22) Filed: Oct. 16, 2020

(65) Prior Publication Data
US 2021/0367063 A1 Nov. 25, 2021

Related U.S. Application Data

(60) Provisional application No. 63/027,618, filed on May 20, 2020.

(51) Int. Cl.
| H01L 29/66 | (2006.01) |
| H01L 29/06 | (2006.01) |
| H01L 29/423 | (2006.01) |
| H01L 29/49 | (2006.01) |
| H01L 29/786 | (2006.01) |
| H01L 21/02 | (2006.01) |

(52) U.S. Cl.
CPC .... *H01L 29/66553* (2013.01); *H01L 21/0228* (2013.01); *H01L 21/02167* (2013.01); *H01L 21/02211* (2013.01); *H01L 21/02603* (2013.01); *H01L 29/0673* (2013.01); *H01L 29/42392* (2013.01); *H01L 29/4983* (2013.01); *H01L 29/66742* (2013.01); *H01L 29/78696* (2013.01)

(58) Field of Classification Search
CPC ......... H01L 21/02167; H01L 21/02211; H01L 21/0228; H01L 21/02603; H01L 29/66553; H01L 29/0673; H01L 29/42392; H01L 29/4983; H01L 29/66742; H01L 29/78696
USPC ........................................................ 257/347
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |

(Continued)

FOREIGN PATENT DOCUMENTS

| KR | 20190056907 A | 5/2019 |
| KR | 20200014235 A | 2/2020 |

(Continued)

*Primary Examiner* — Tong-Ho Kim
(74) *Attorney, Agent, or Firm* — Slater Matsil, LLP

(57) ABSTRACT

Semiconductor devices and methods of manufacturing are presented in which inner spacers for nanostructures are manufactured. In embodiments a dielectric material is deposited for the inner spacer and then treated. The treatment may add material and cause an expansion in volume in order to close any seams that can interfere with subsequent processes.

20 Claims, 50 Drawing Sheets

(56) References Cited

U.S. PATENT DOCUMENTS

| | | |
|---|---|---|
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,947,769 B1 * | 4/2018 | Han .................. H01L 29/66795 |
| 2019/0019676 A1 | 1/2019 | Zhang et al. |
| 2019/0157444 A1 | 5/2019 | Yang et al. |
| 2019/0267463 A1 | 8/2019 | Chao et al. |
| 2020/0020569 A1 | 1/2020 | Lin et al. |
| 2020/0044060 A1 | 2/2020 | Cheng et al. |
| 2020/0185539 A1 * | 6/2020 | Lee ....................... H01L 29/513 |

FOREIGN PATENT DOCUMENTS

| | | |
|---|---|---|
| TW | 201917775 A | 5/2019 |
| TW | 202006798 A | 2/2020 |

* cited by examiner

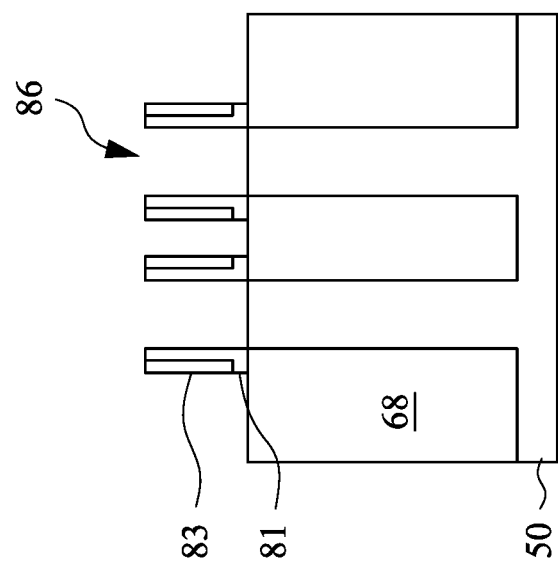

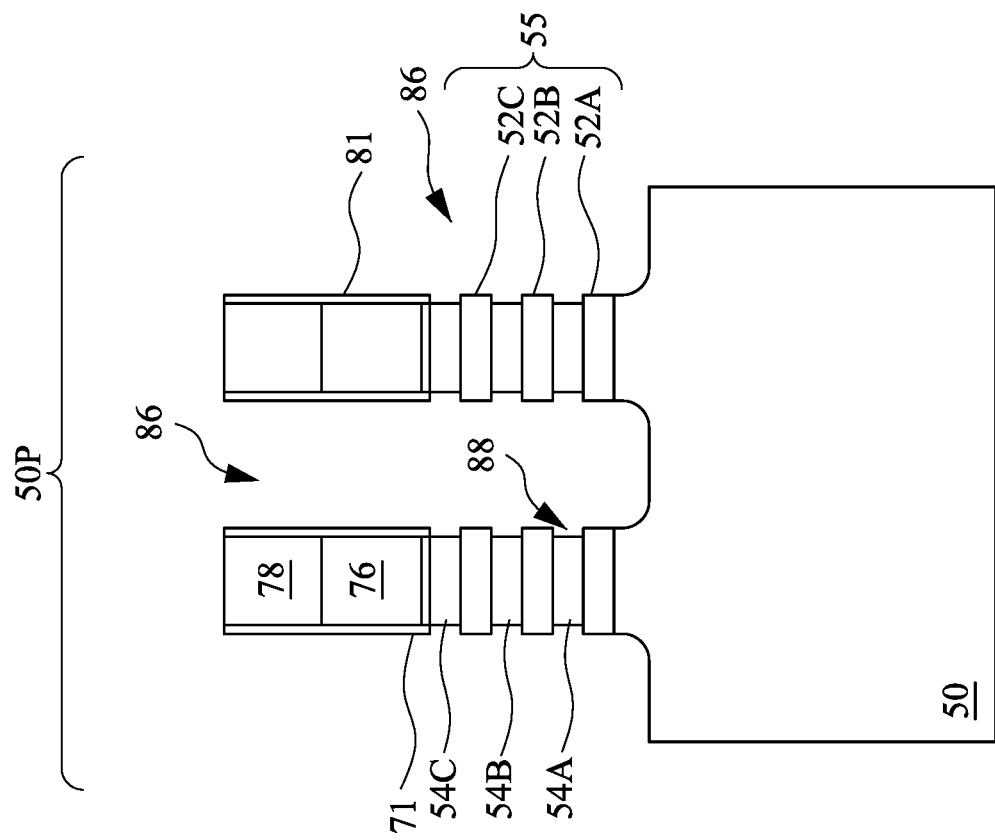
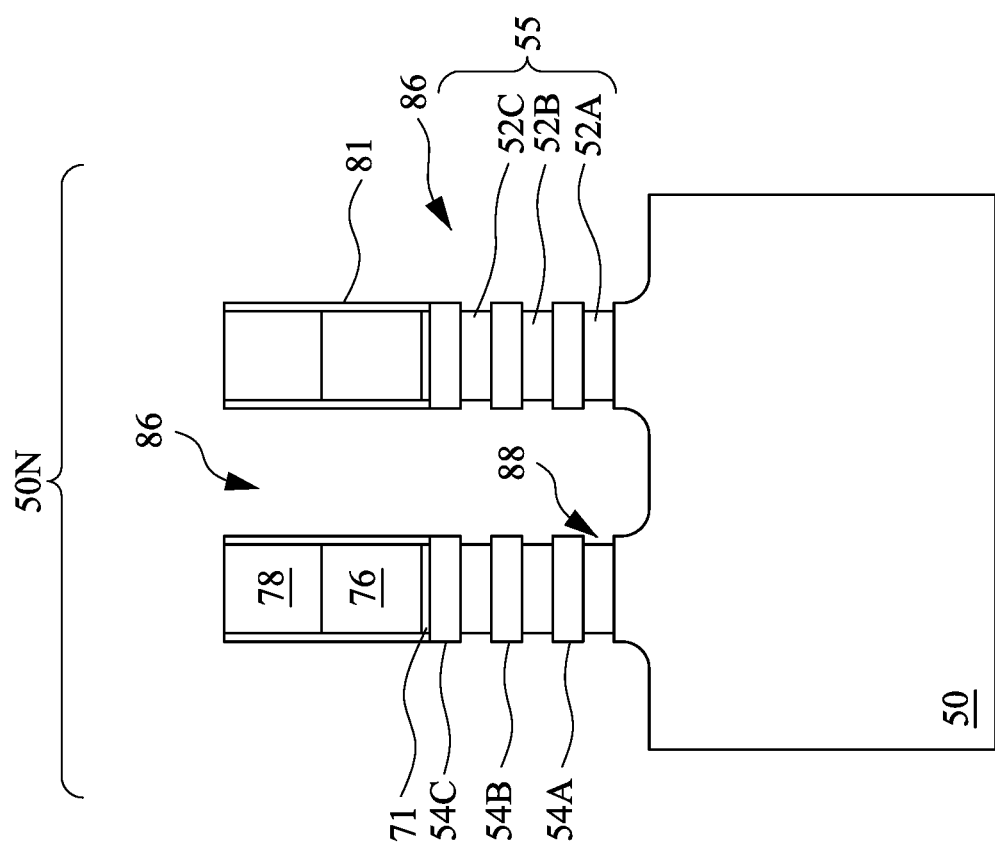
Fig. 10B

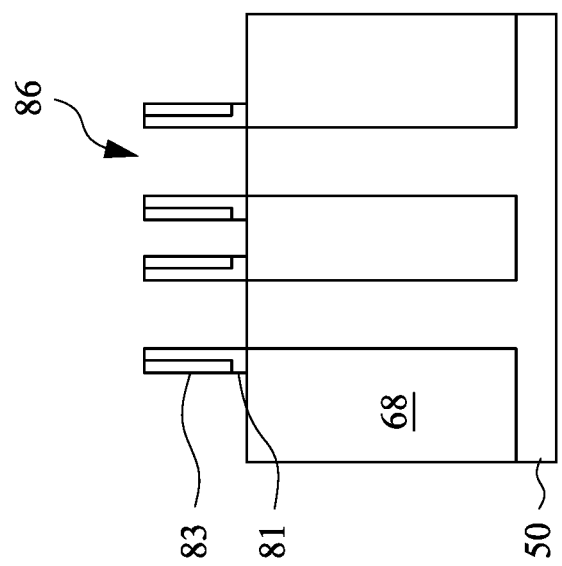

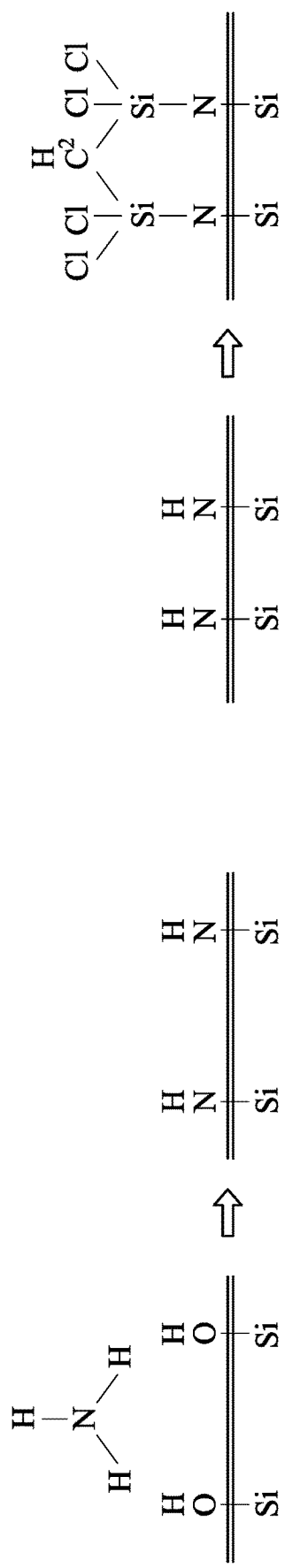
Fig. 11F
Fig. 11G
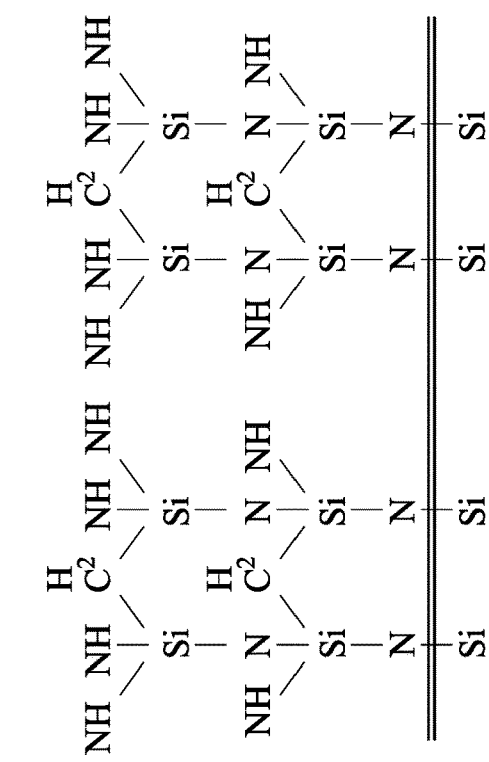
Fig. 11H

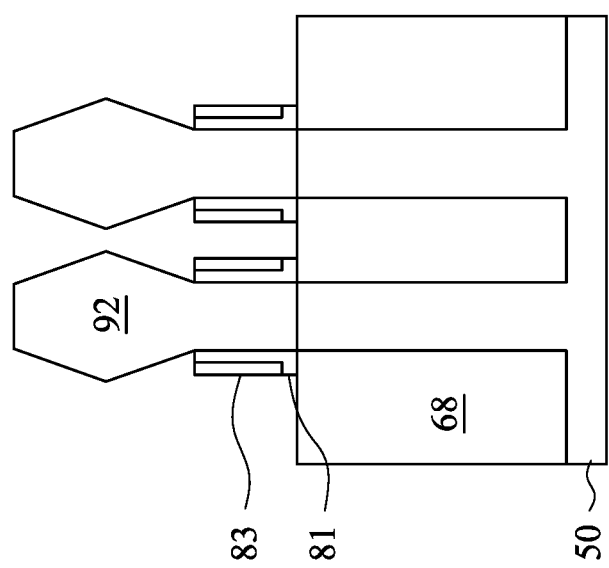

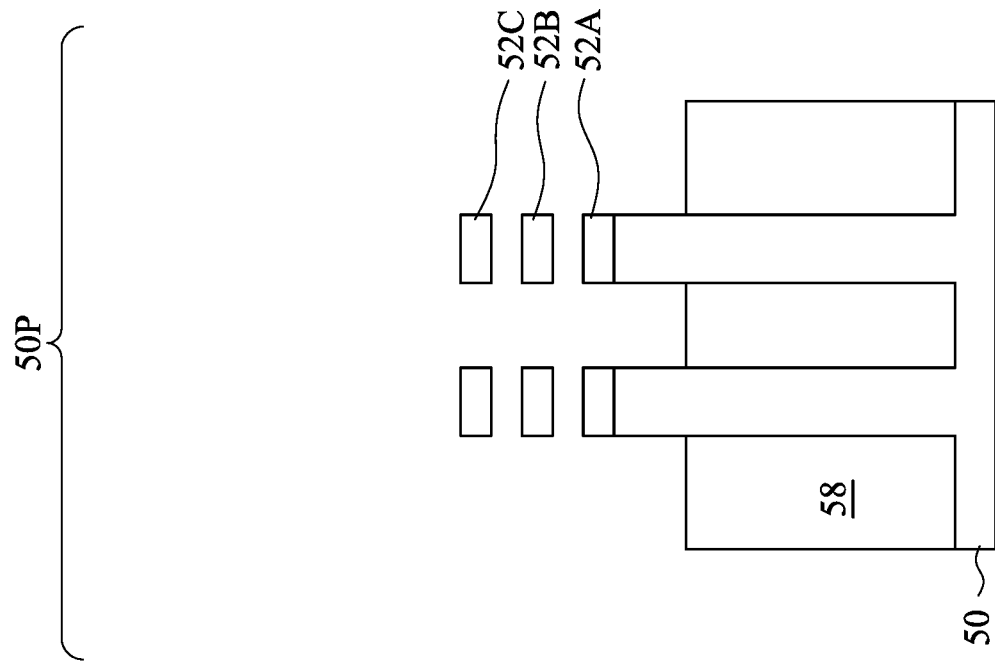
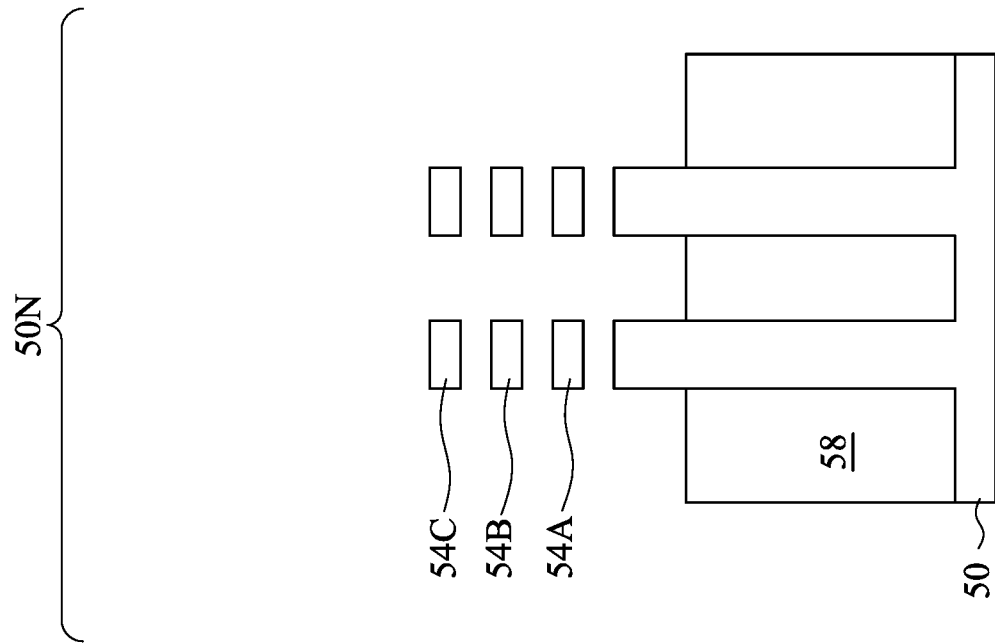
Fig. 17A

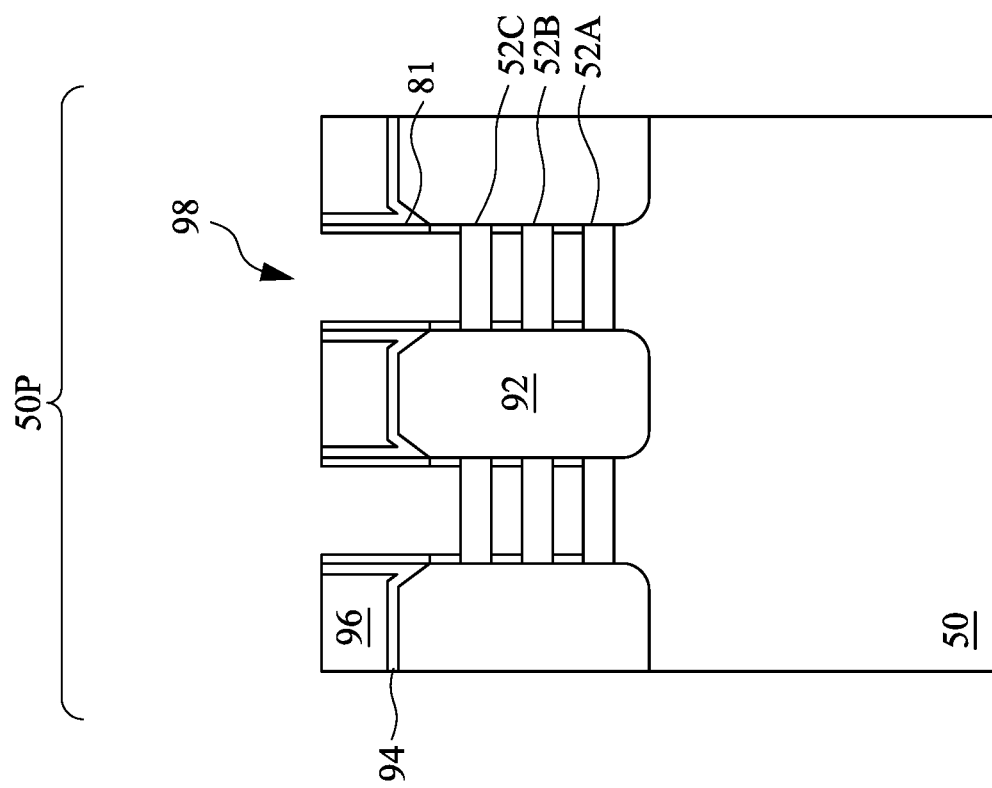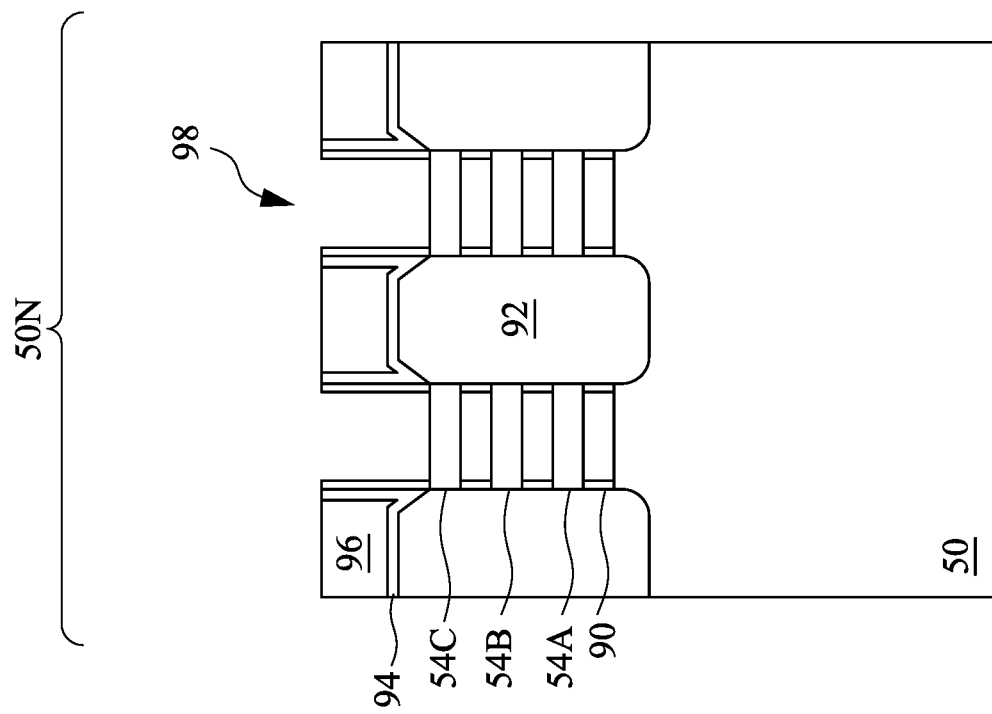
Fig. 17B

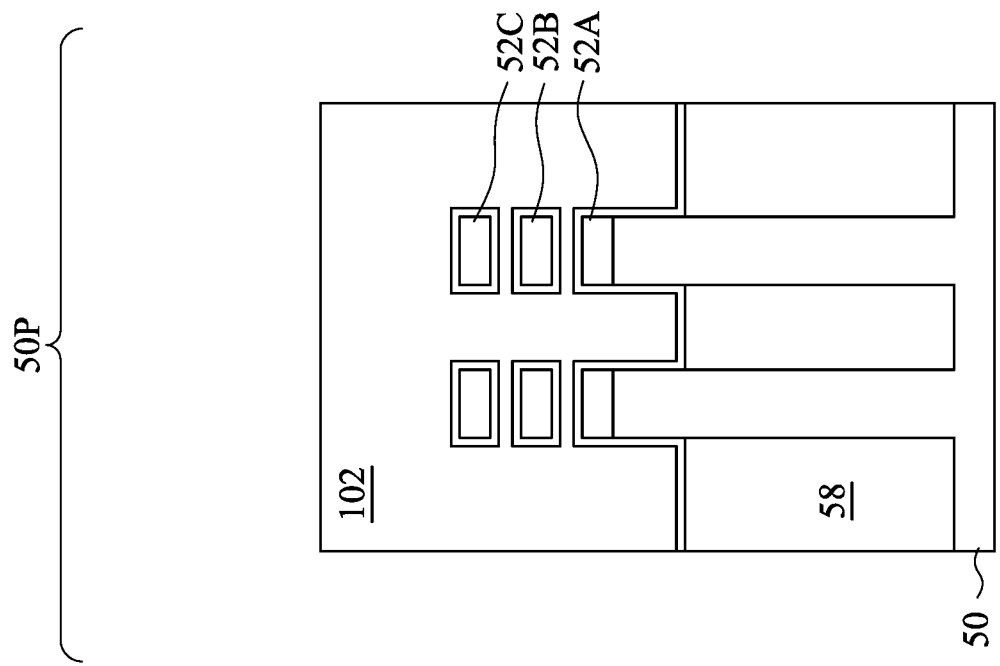
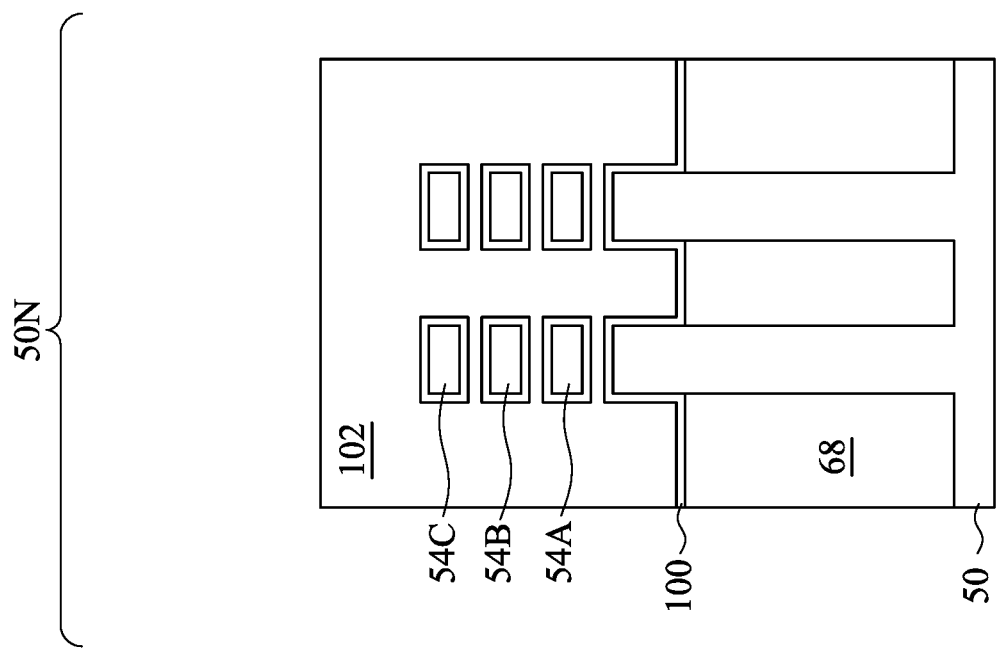
Fig. 18A

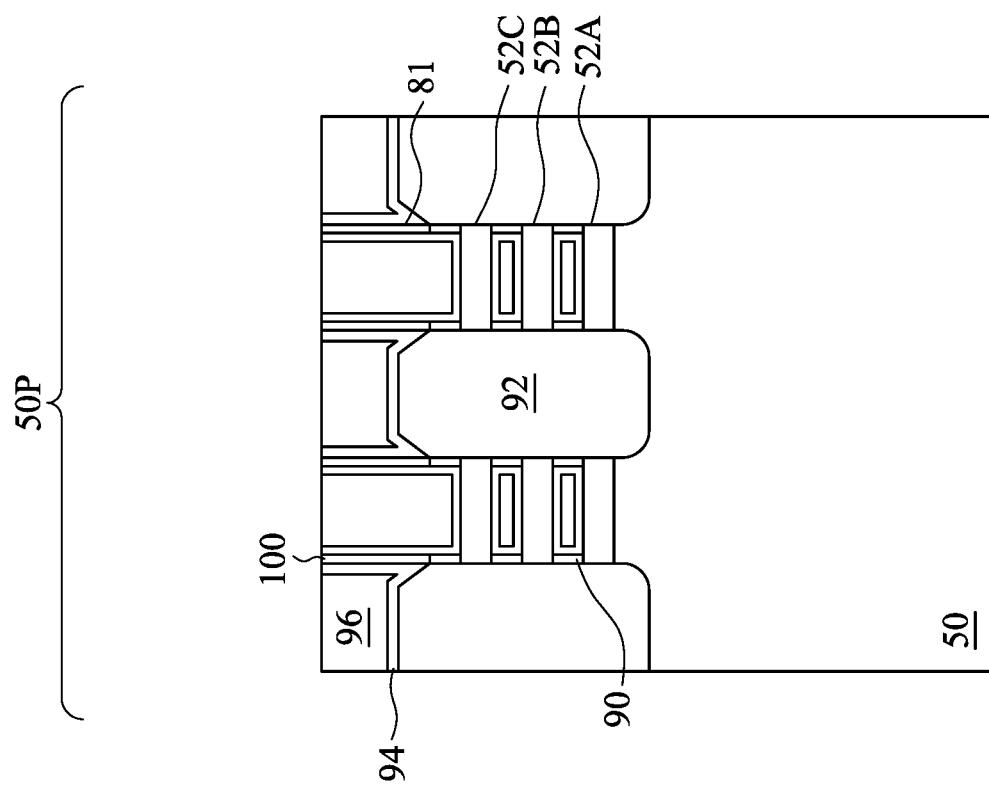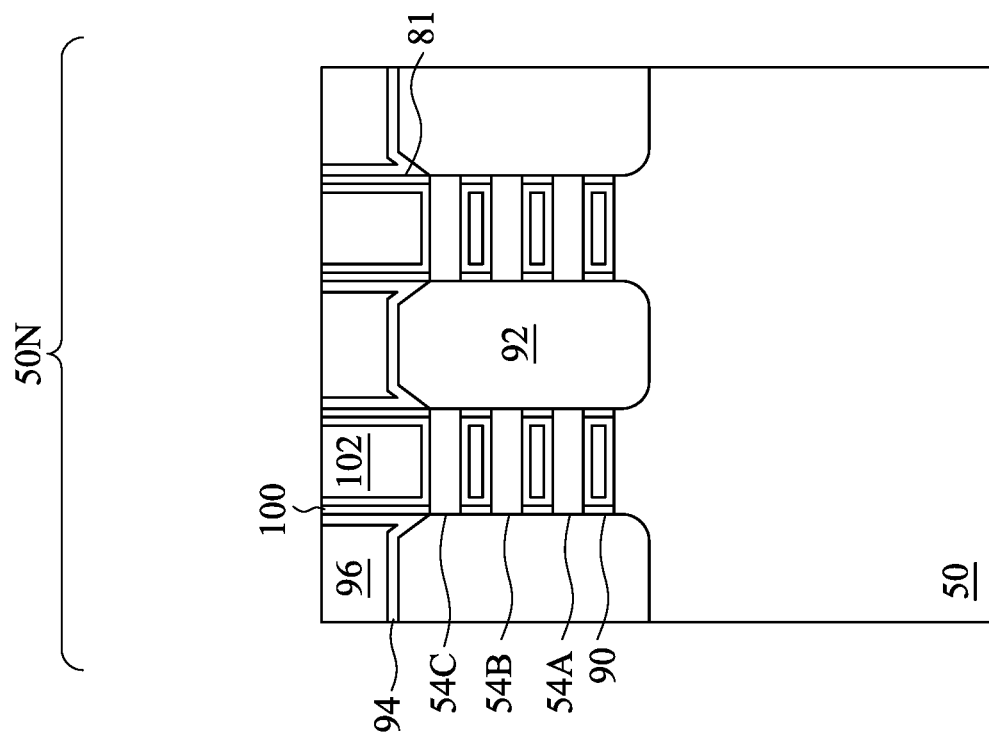
Fig. 18B

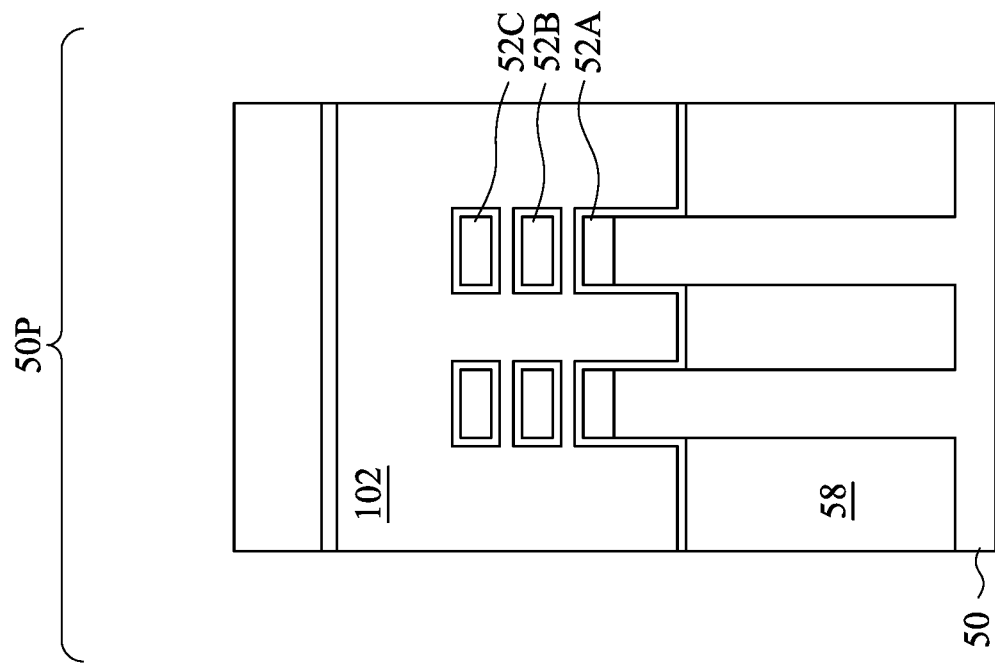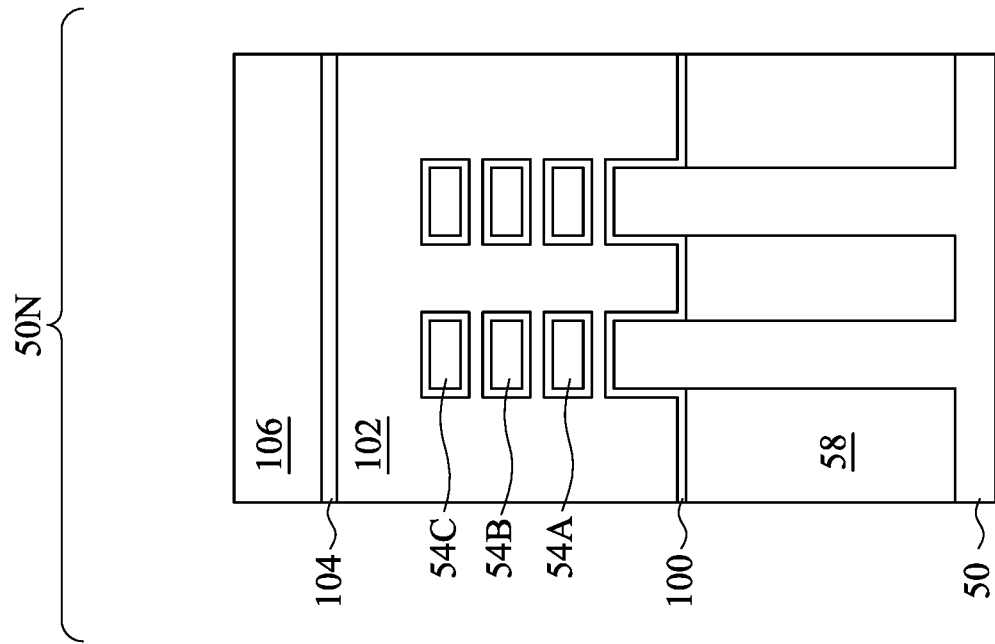
Fig. 19A

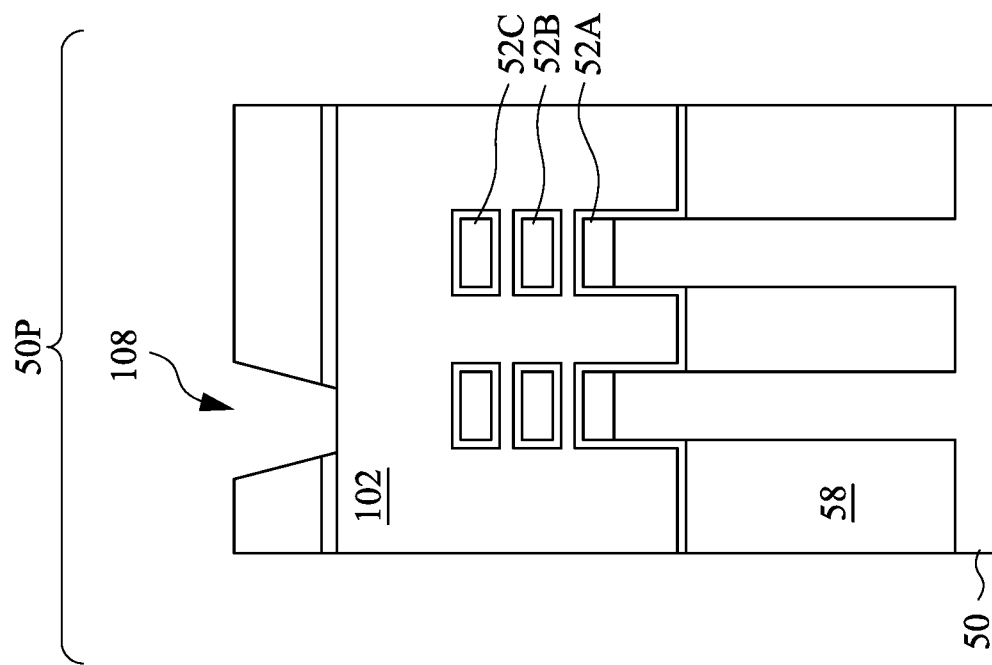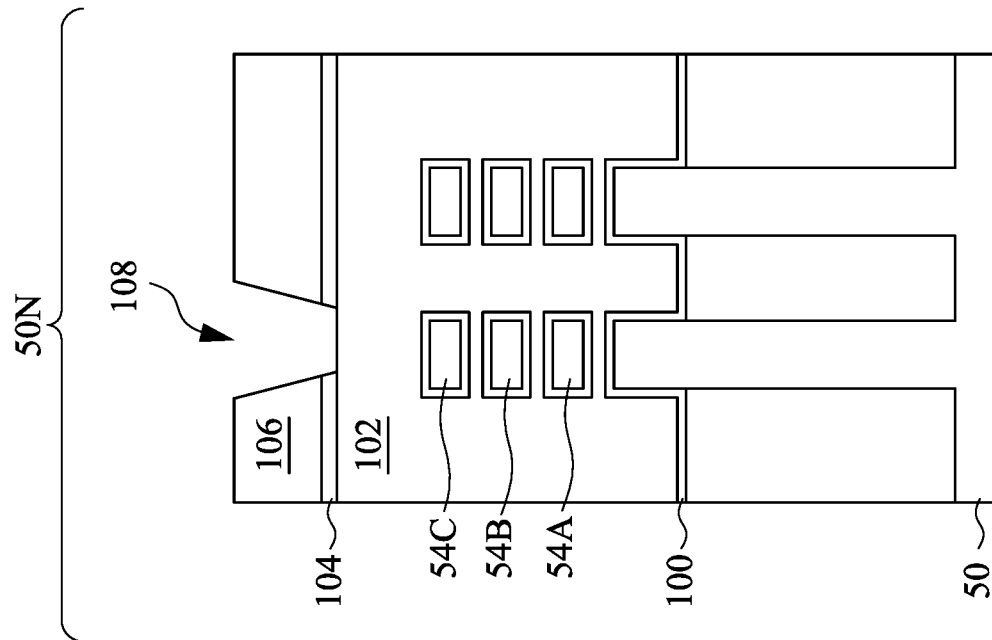
Fig. 20A

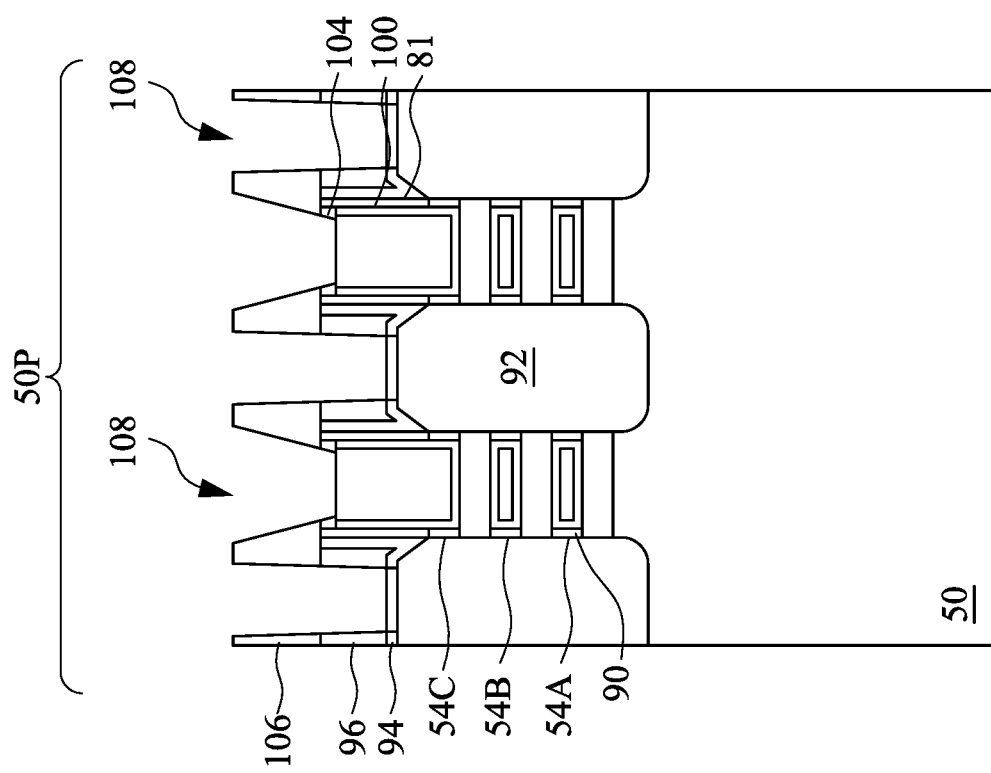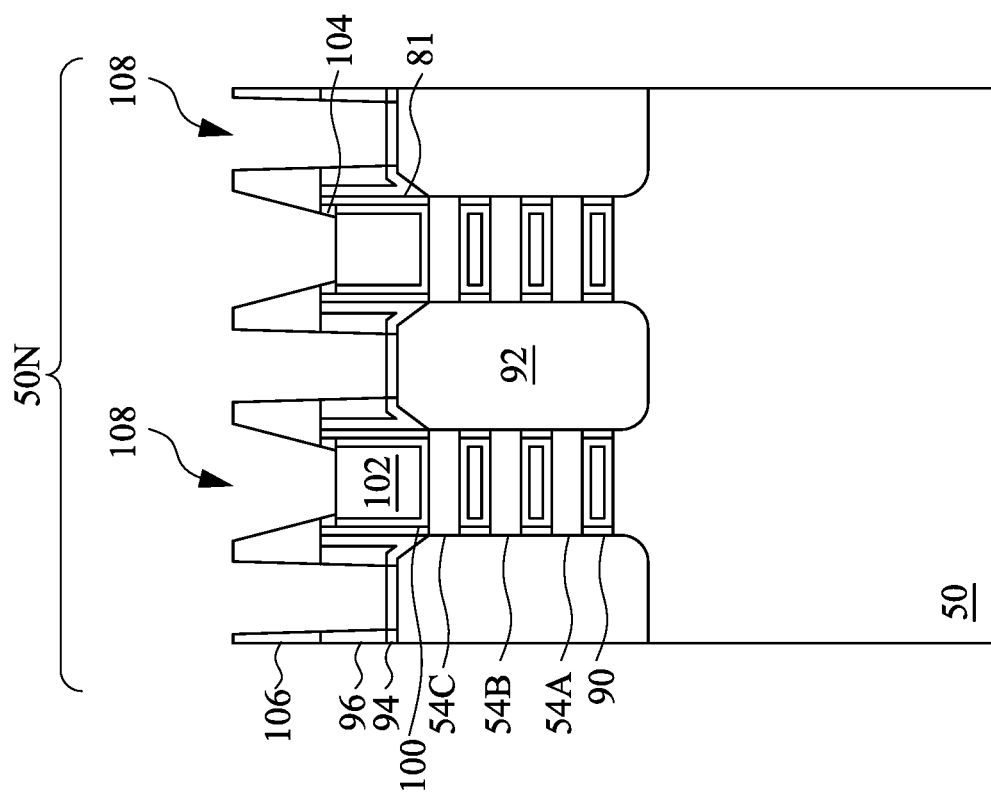
Fig. 20B

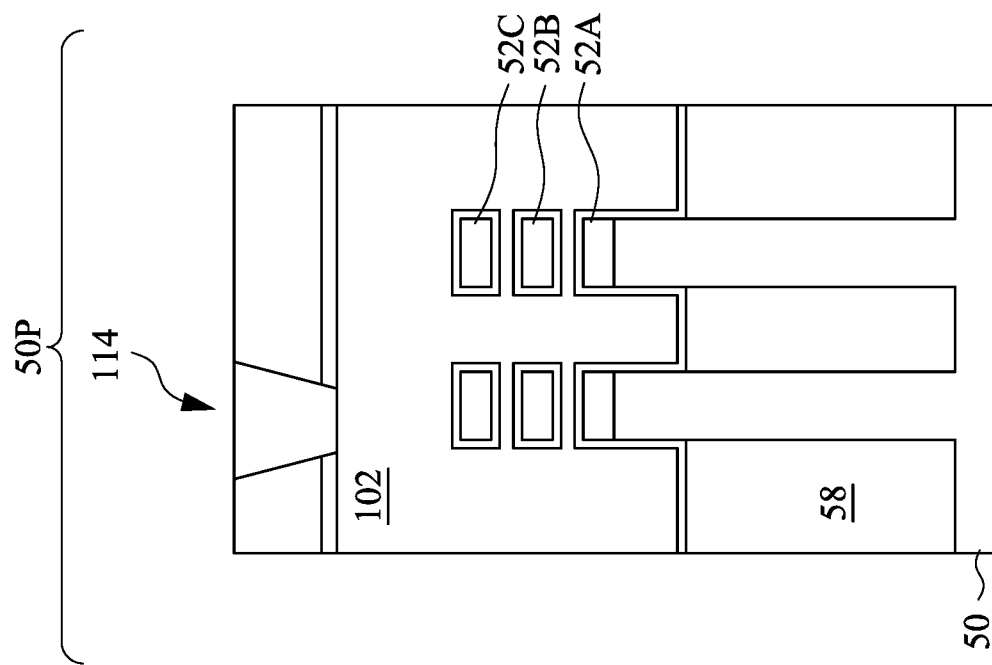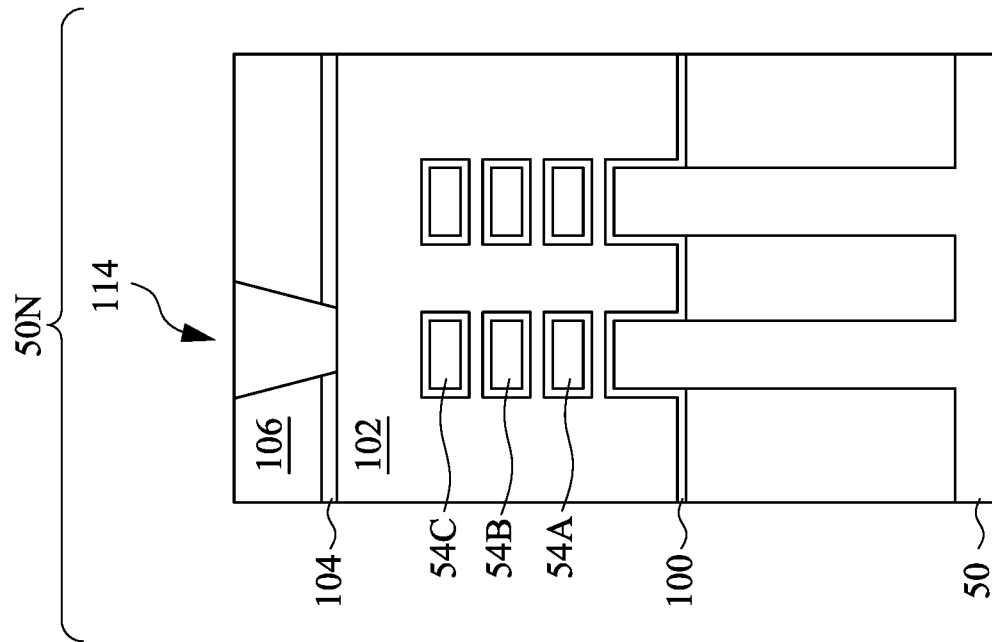
Fig. 21A

SEMICONDUCTOR DEVICE AND METHOD OF MANUFACTURE

PRIORITY

This application claims the benefit of U.S. Provisional Application No. 63/027,618, filed on May 20, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B, 8A, 8B, 9A, 9B, 10A, 10B, 11A, 11B, 11C, 11D, 11E, 11F, 11G, 11H, 11I, 12A, 12B, 12C, 12D, 13A, 13B, 13C, 13D, 14A, 14B, 14C, 15A, 15B, 16A, 16B, 17A, 17B, 18A, 18B, 19A, 19B, 19C, 20A, 20B, 20C, 21A, 21B, and 21C are cross-sectional views of intermediate stages in the manufacturing of nano-FETs, in accordance with some embodiments.

DETAILED DESCRIPTION

Figure 1:
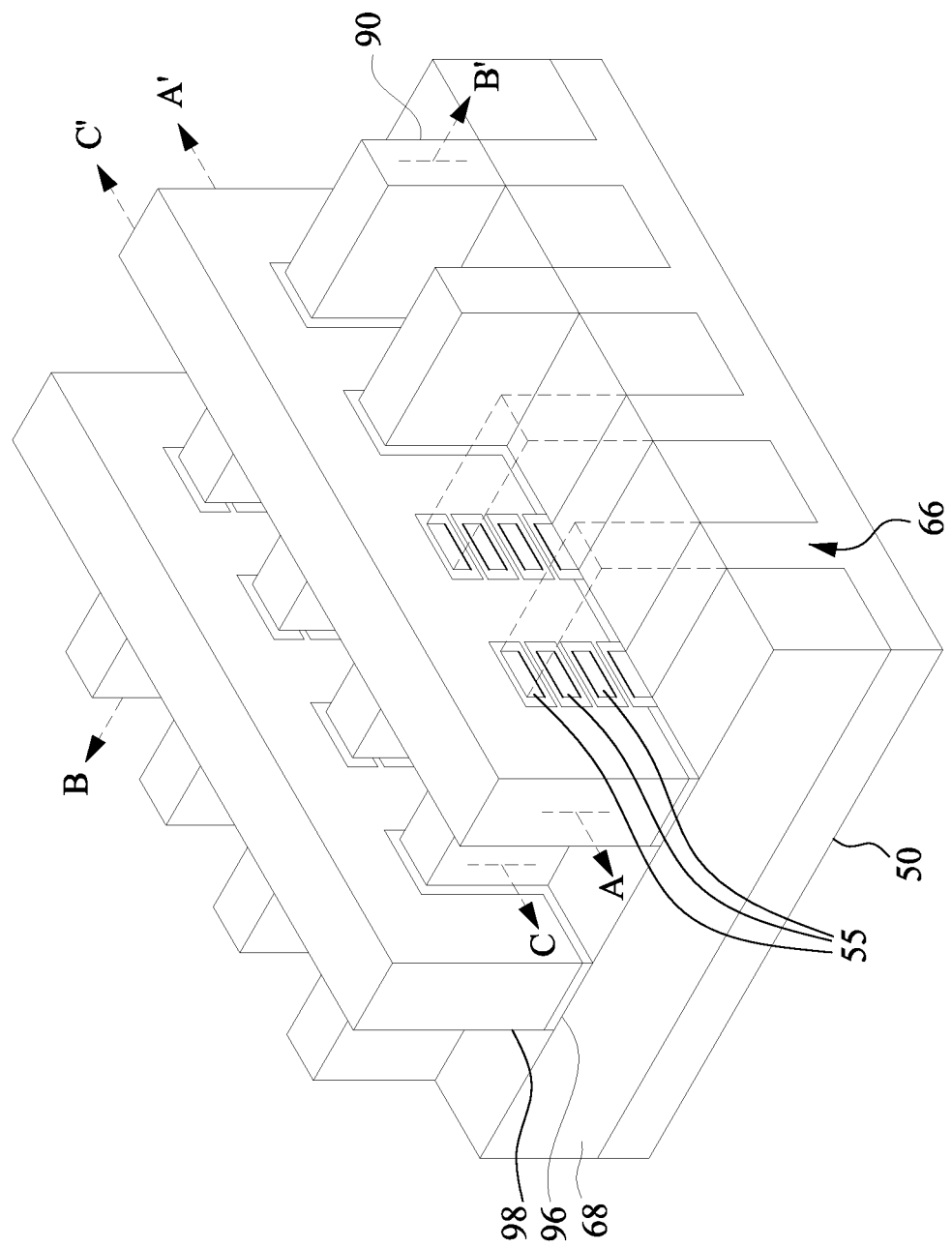
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments are described below in a particular context, a die comprising nano-FETs made using a 5 nm processing node. Various embodiments may be applied, however, to dies comprising other types of transistors (e.g., fin field effect transistors (FinFETs), planar transistors, or the like) in lieu of or in combination with the nano-FETs and any suitable process node, such as the 3 nm process node.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. STI regions 68 are disposed between adjacent fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring STI regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 98 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 21C are cross-sectional views of intermediate stages in the manufacturing of nano-FETs, in accordance with some embodiments. FIGS. 2 through 5, 6A, 11A, 13A, 14A, 15A, 16A, 17A, 18A, 19A, and 20A illustrate reference cross-section A-A' illustrated in FIG. 1. FIGS. 6B, 7B, 8B, 9B, 10B, 11B, 11C, 13B, 14B, 15B, 16B, 17B, 18B, 19B, and 20B illustrate reference cross-section B-B' illustrated in FIG. 1. FIGS. 7A, 8A, 9A, 10A, 11A, 13C, 19C, and 20C illustrate reference cross-section C-C' illustrated in FIG. 1.

Figure 2:
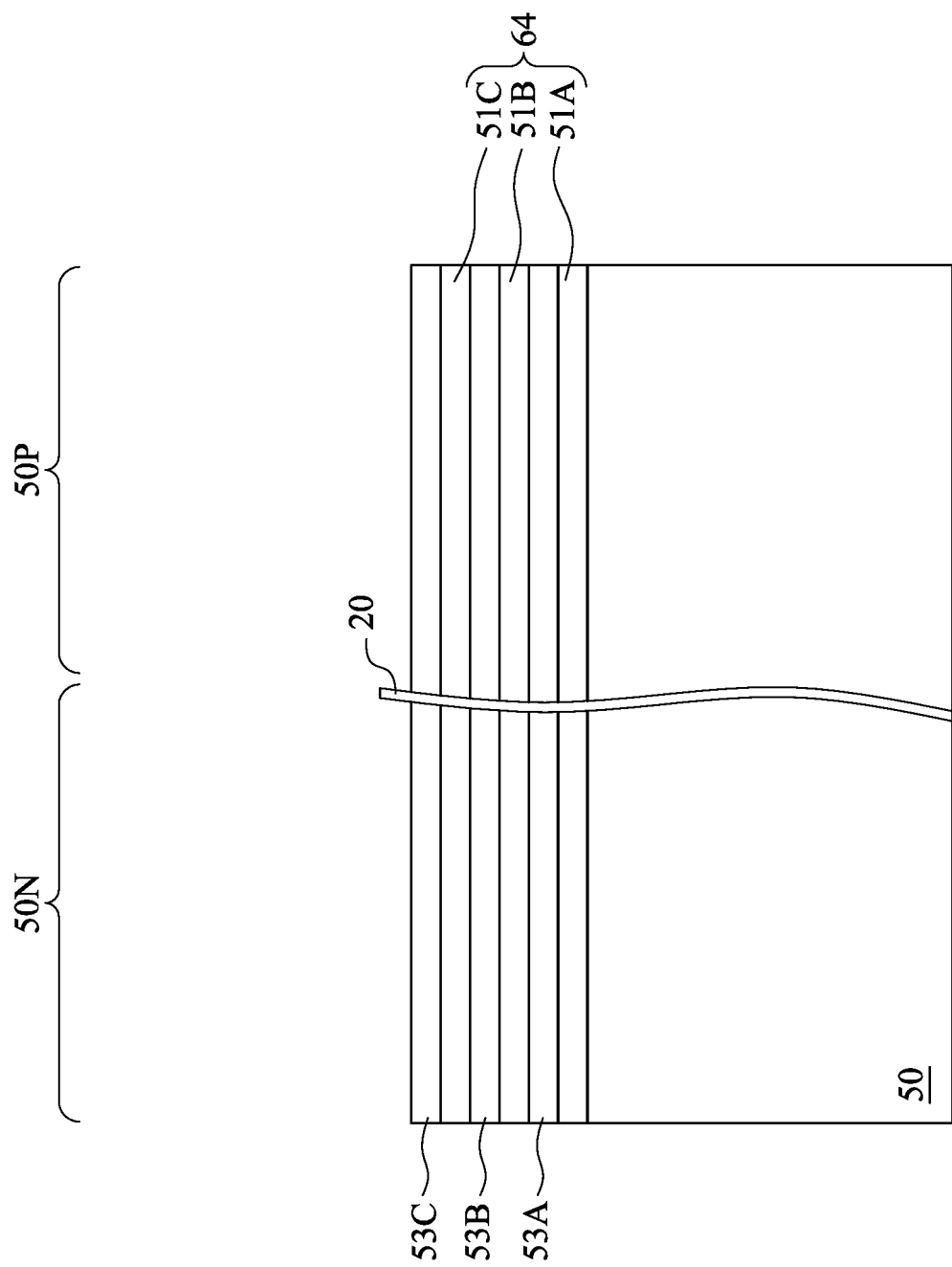

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the p-type region 50P. Also, the first semiconductor layers 51 will be removed and the second semiconductor layers 53 will be patterned to form channel regions of nano-FETs in the n-type regions 50N. Nevertheless, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type regions 50P. In still other embodiments, the first semiconductor layers 51 may be removed and the second semiconductor layers 53 may be patterned to form channel regions of nano-FETS in both the n-type region 50N and the p-type region 50P. In other embodiments, the second semiconductor layers 53 may be removed and the first semiconductor layers 51 may be patterned to form channel regions of nano-FETs in both the n-type region 50N and the p-type region 50P.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type NSFETS. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type NSFETS.

Figure 3:
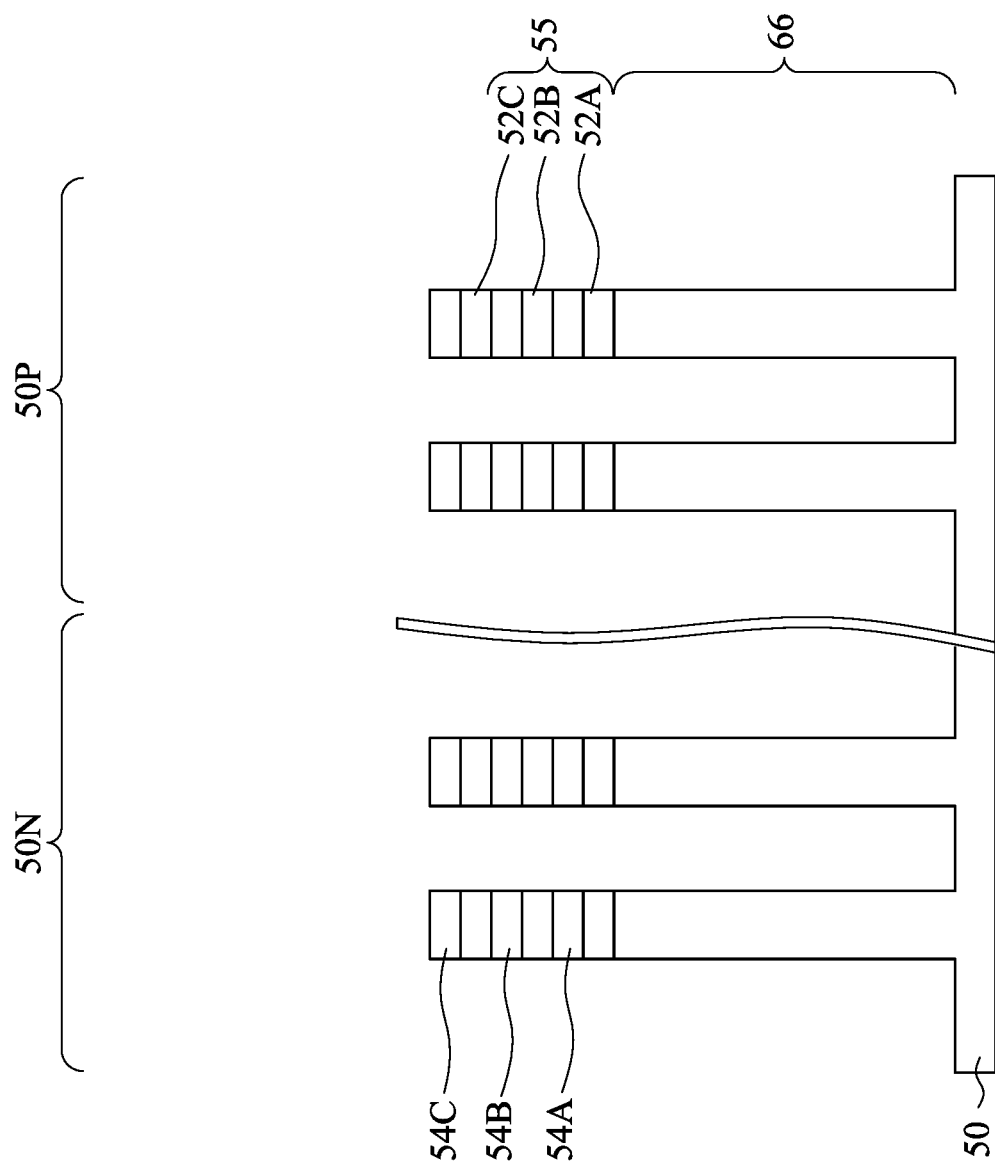

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
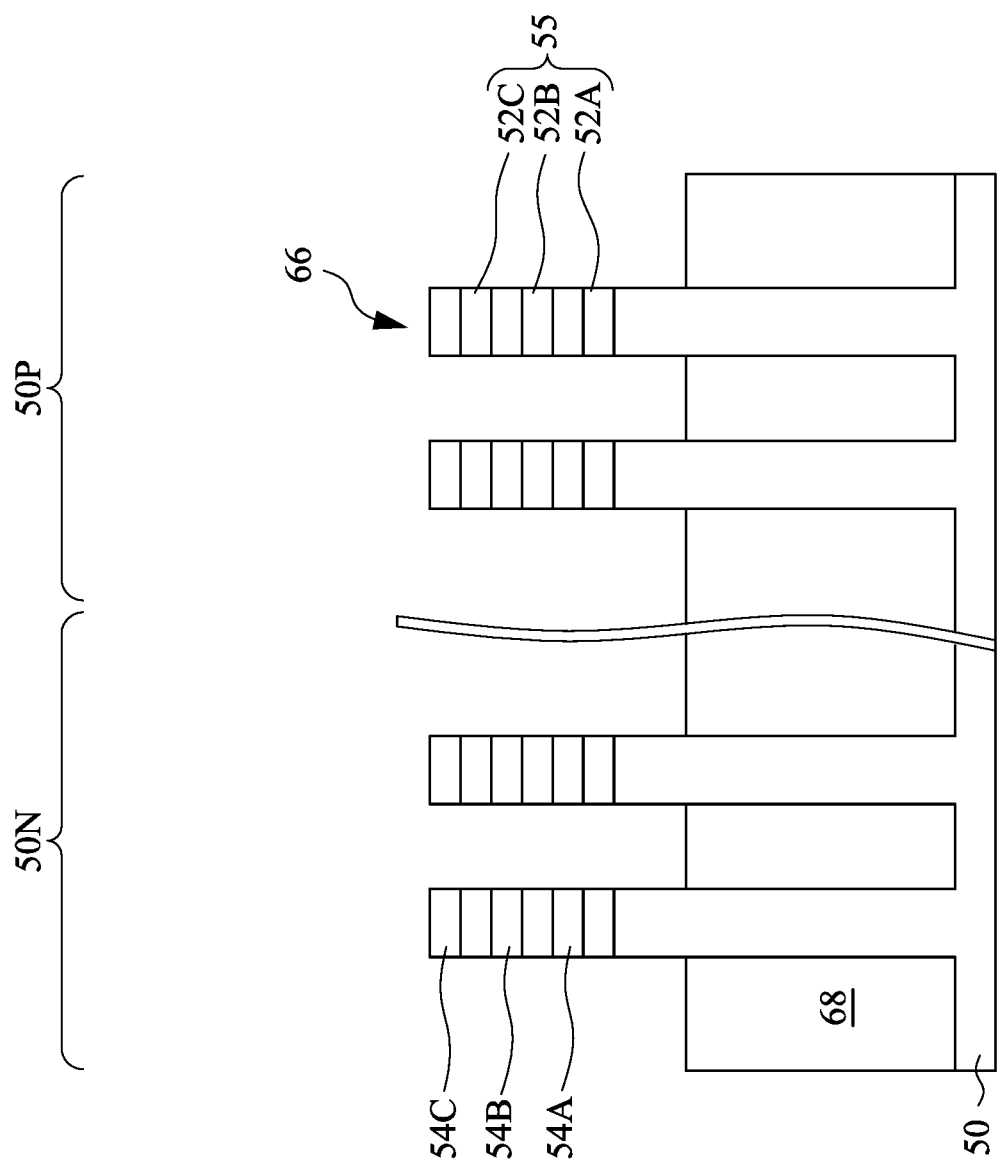

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An annealing process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the regions 50N and the region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implantation steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implantation(s) of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implantation(s) of the n-type region 50N and the p-type region 50P, an annealing may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
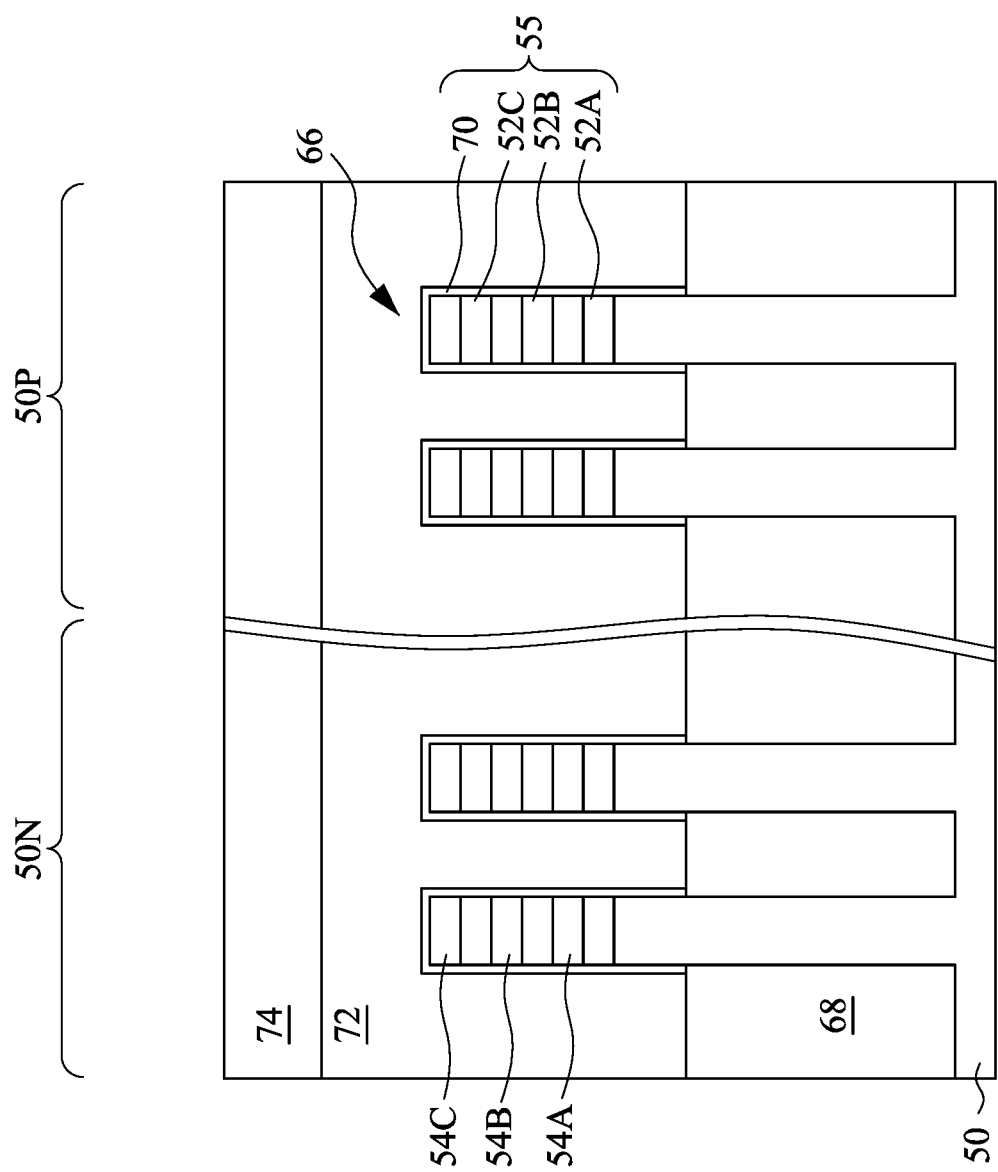

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
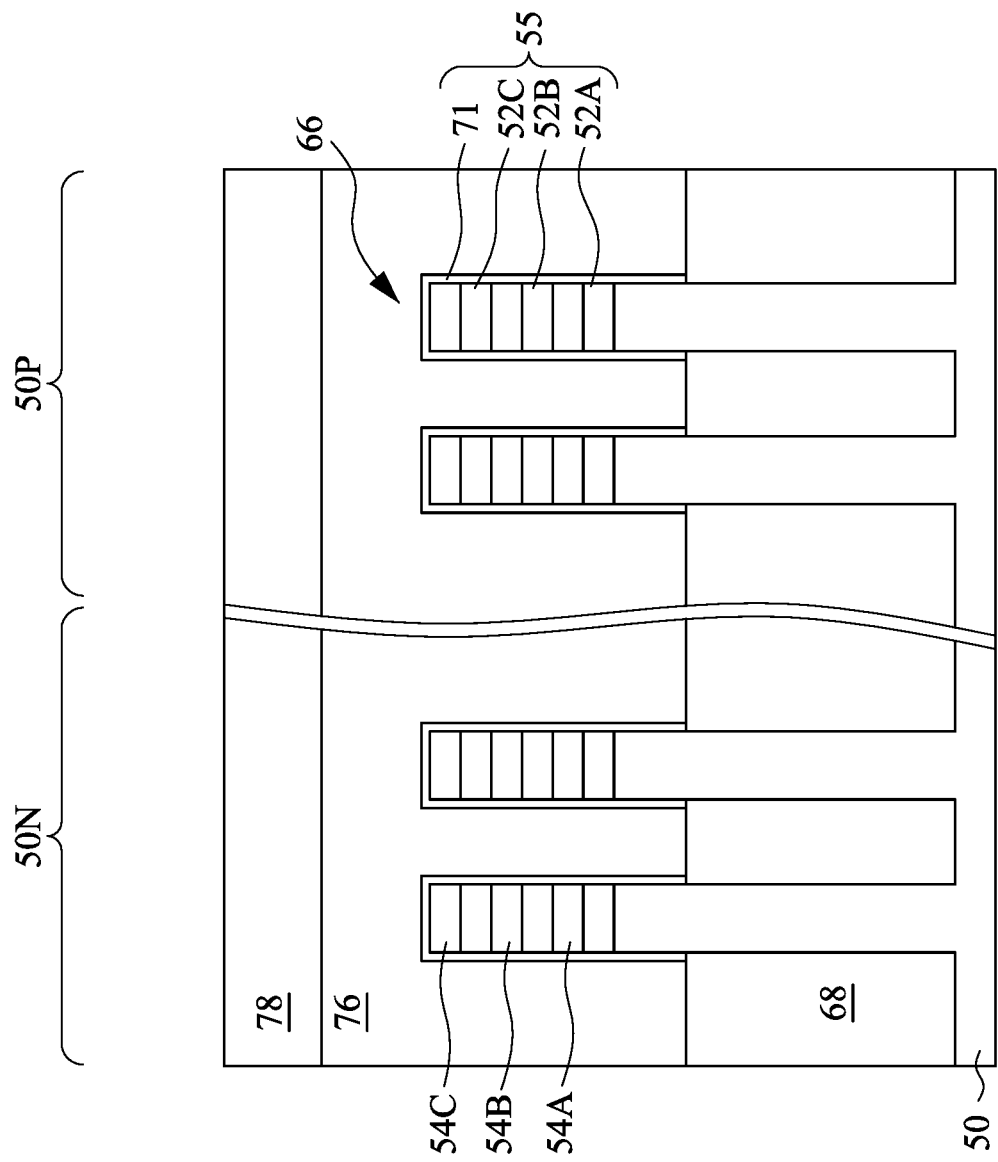
Figure 6B:
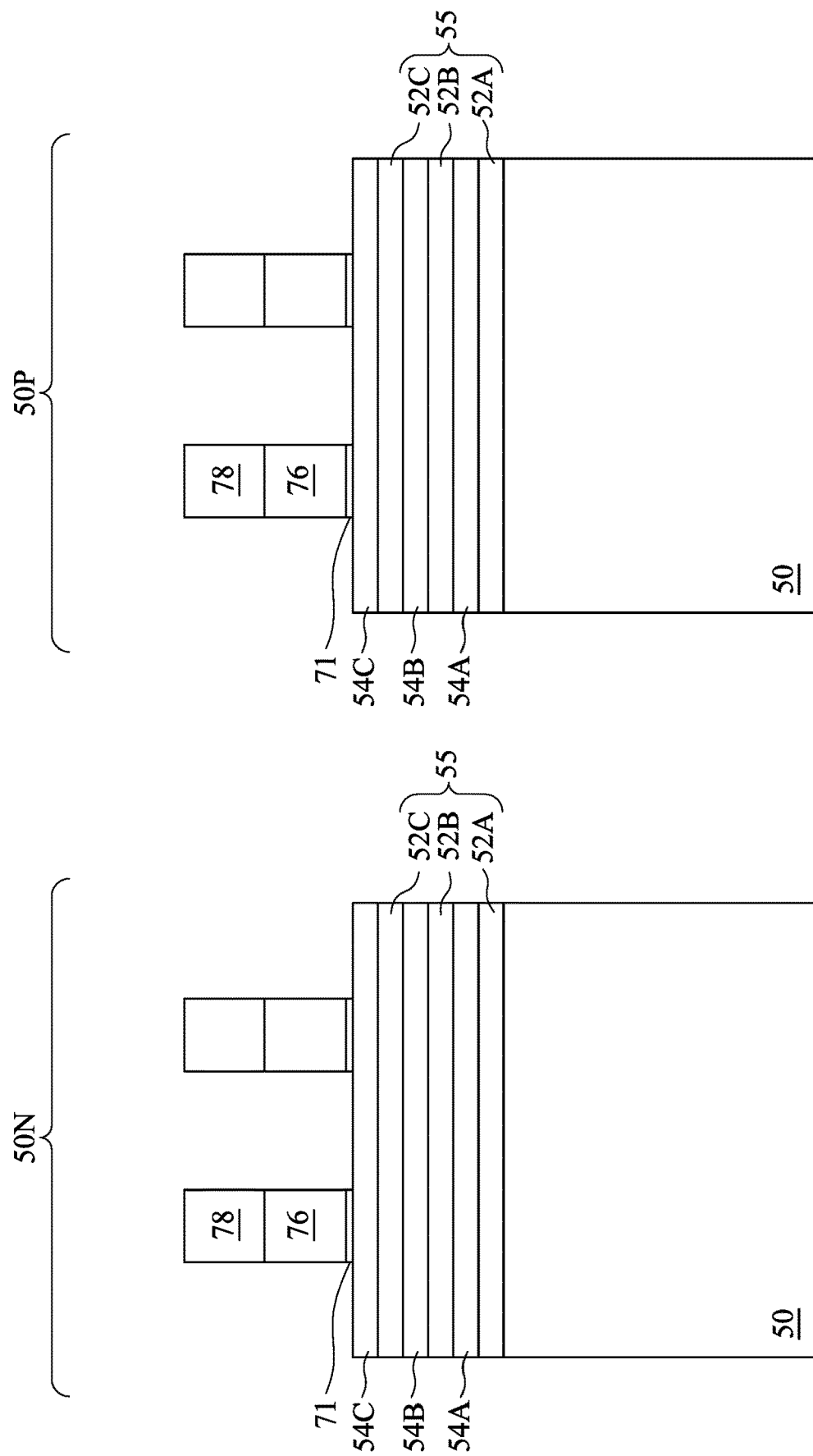

FIGS. 6A through 18B illustrate various additional steps in the manufacturing of embodiment devices. FIGS. 6A, 7A, 8A, 9A, 10A, 11A, 12A, 12C, 13A, 13C, 14A, 15A, and 18A illustrate features in either the regions 50N or the regions 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7A:
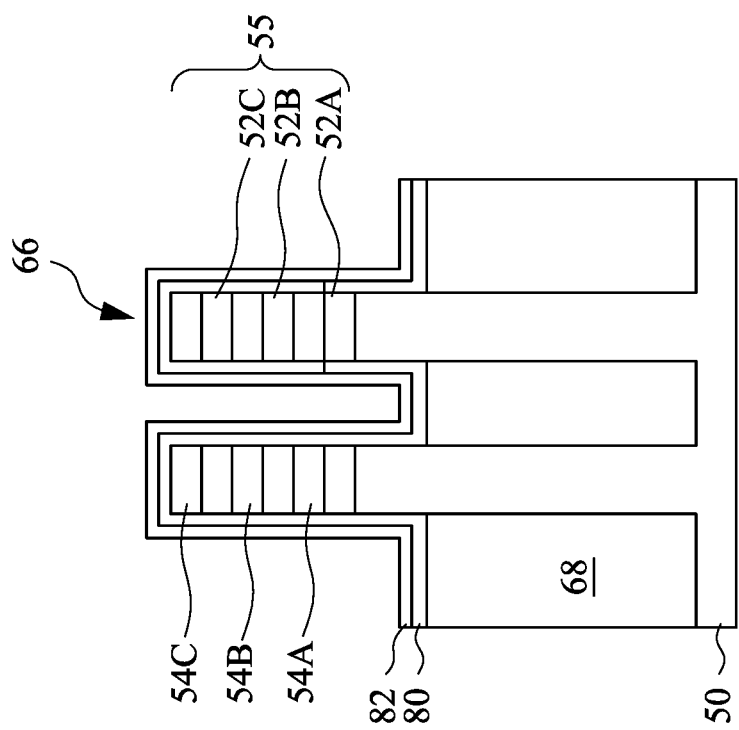
Figure 7B:
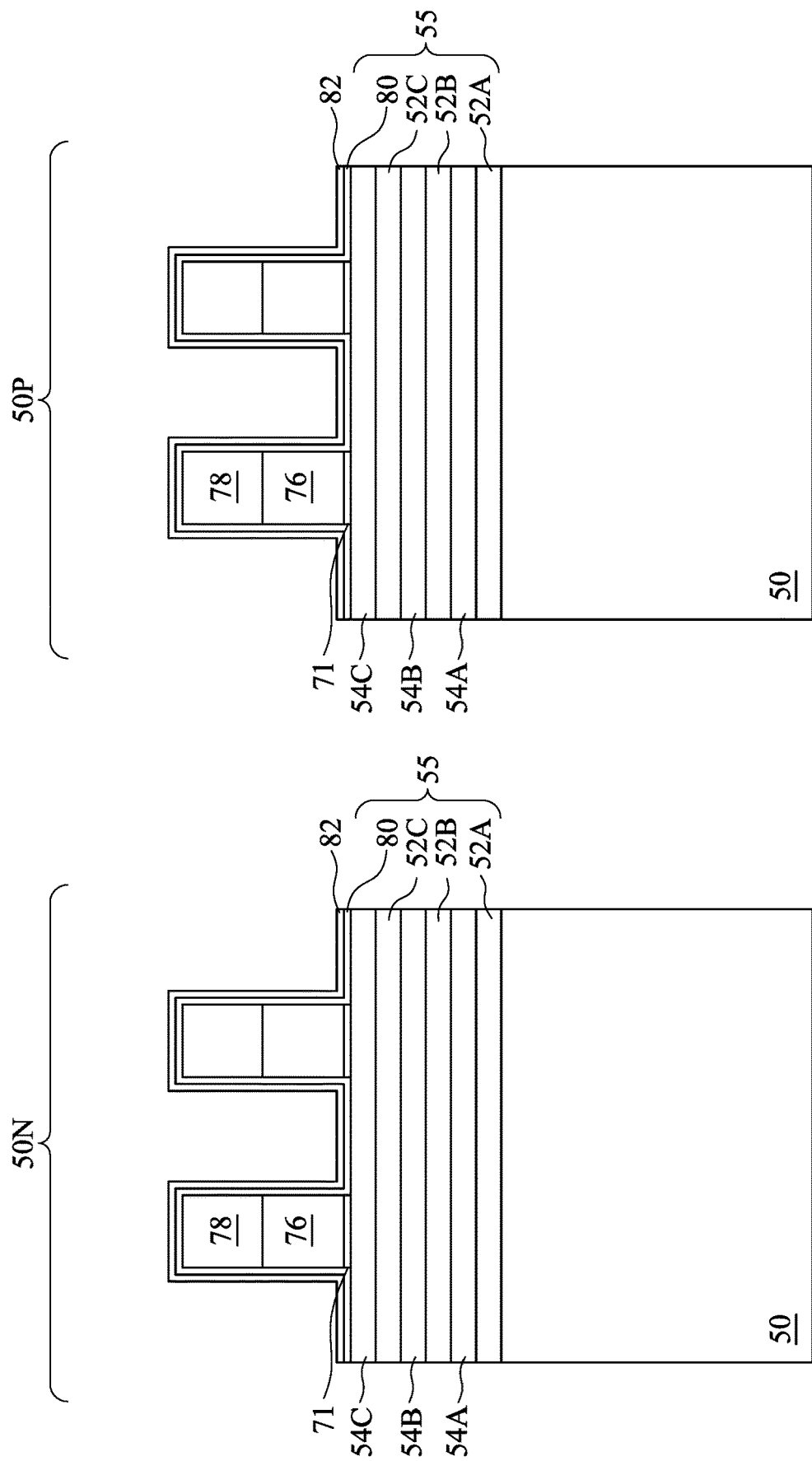

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An annealing may be used to repair implant damage and to activate the implanted impurities.

Figure 8A:
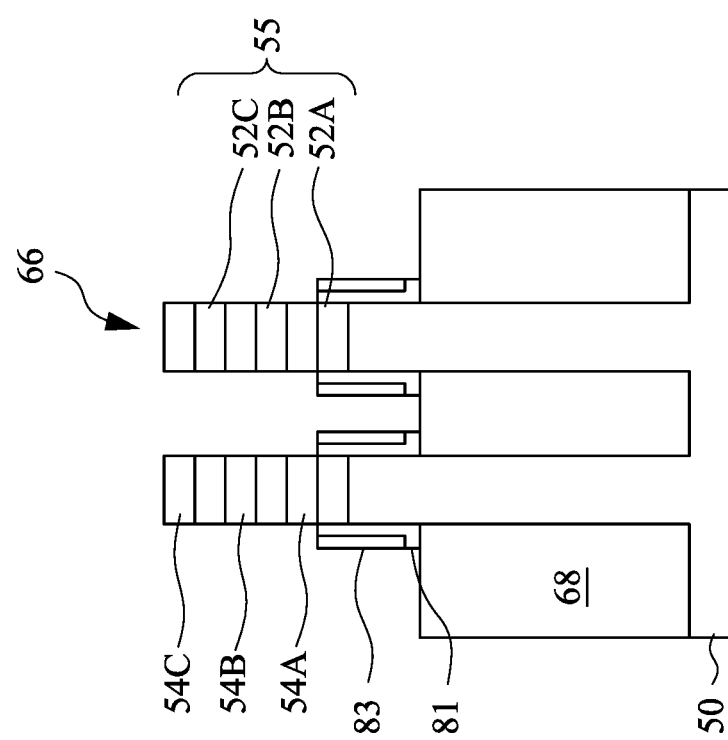
Figure 8B:
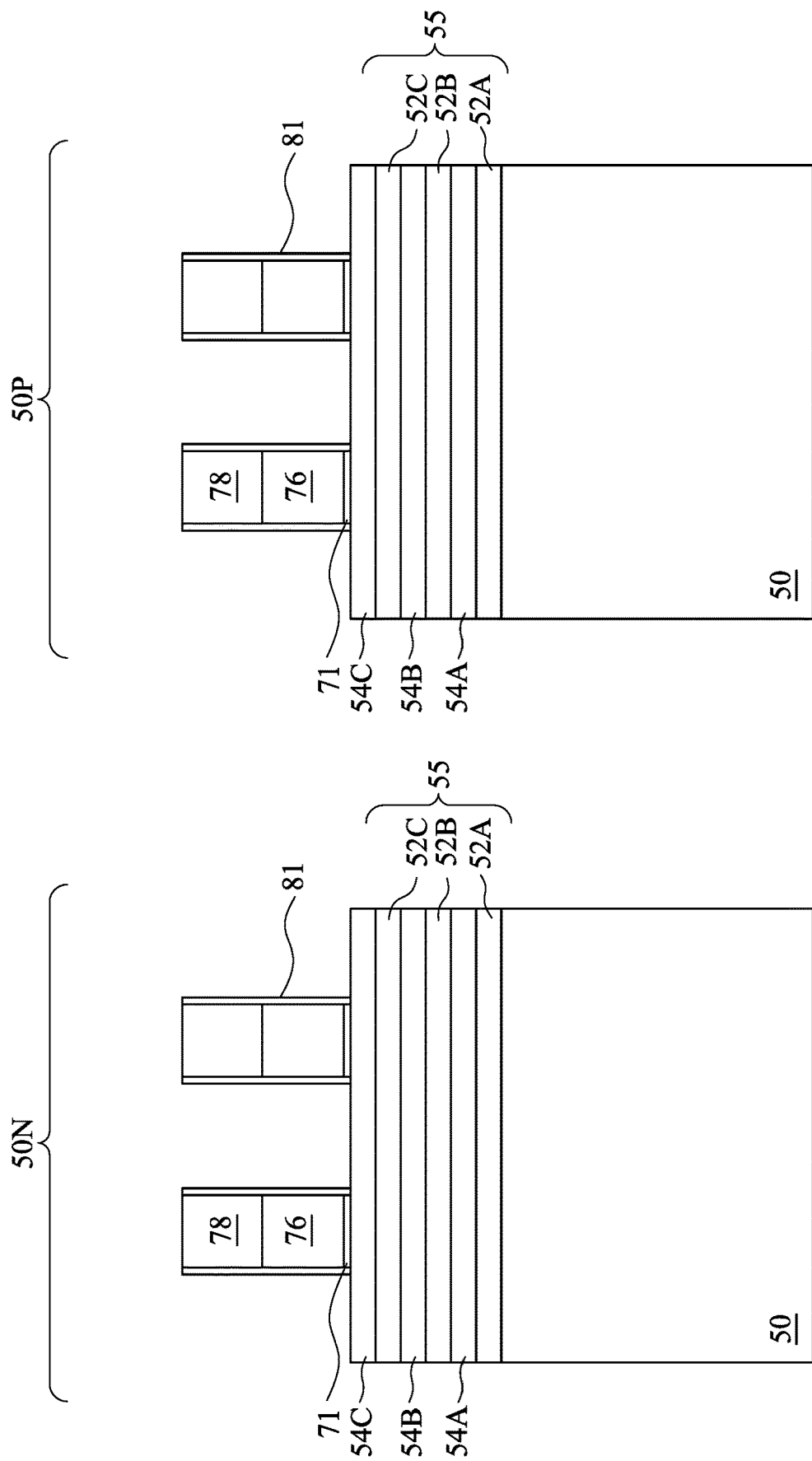

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 60. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
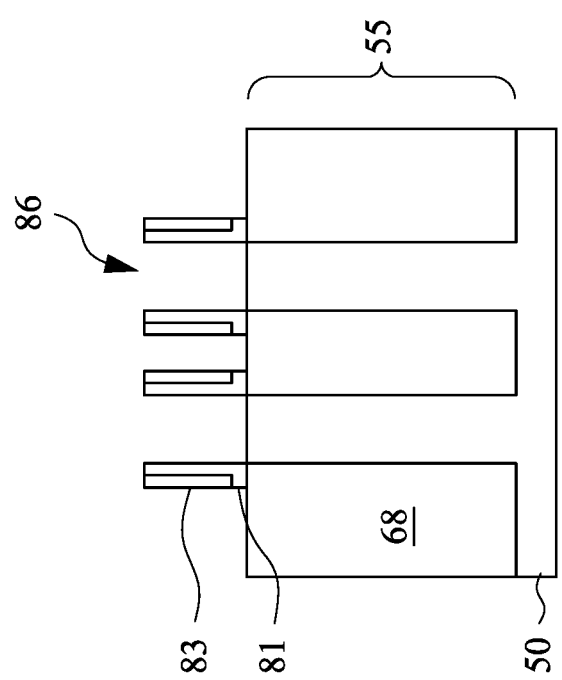
Figure 9B:
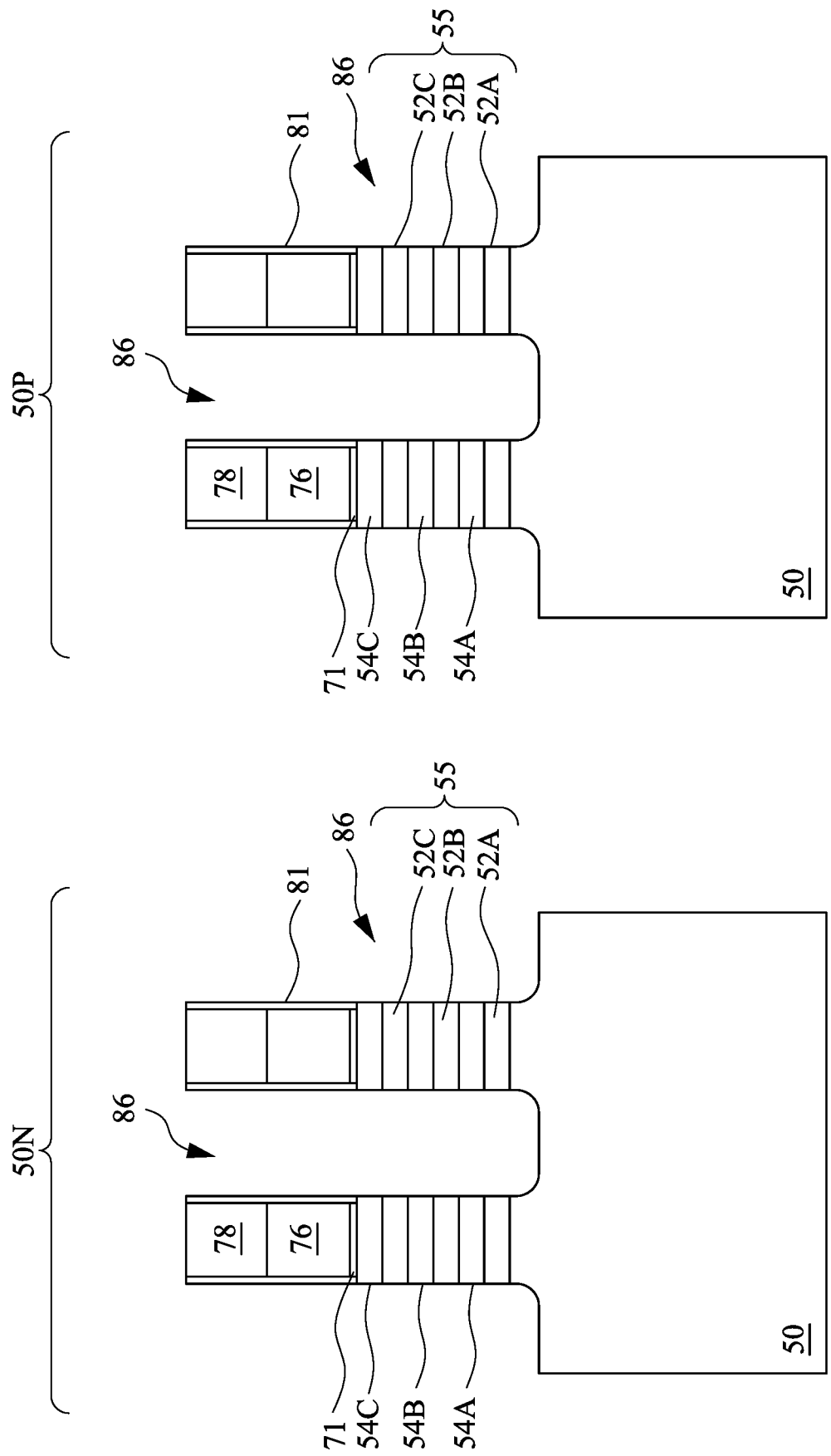

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 58 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

In FIGS. 10A and 10B, portions of sidewalls of the layers of the multi-layer stack 64 formed of the first semiconductor materials (e.g., the first nanostructures 52) exposed by the first recesses 86 are etched to form sidewall recesses 88 in the n-type region 50N, and portions of sidewalls of the layers of the multi-layer stack 56 formed of the second semiconductor materials (e.g., the second nanostructures 54) exposed by the first recesses 86 are etched to form sidewall recesses 88 in the p-type region 50P. Although sidewalls of the first nanostructures 52 and the second nanostructures 54 in sidewall recesses 88 are illustrated as being straight in FIG. 10B, the sidewalls may be concave or convex. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52 in the n-type region 50N, and a dry etch process with hydrogen fluoride, another fluorine-based etchant, or the like may be used to etch sidewalls of the second nanostructures 54 in the p-type region 50P.

Figure 11B:
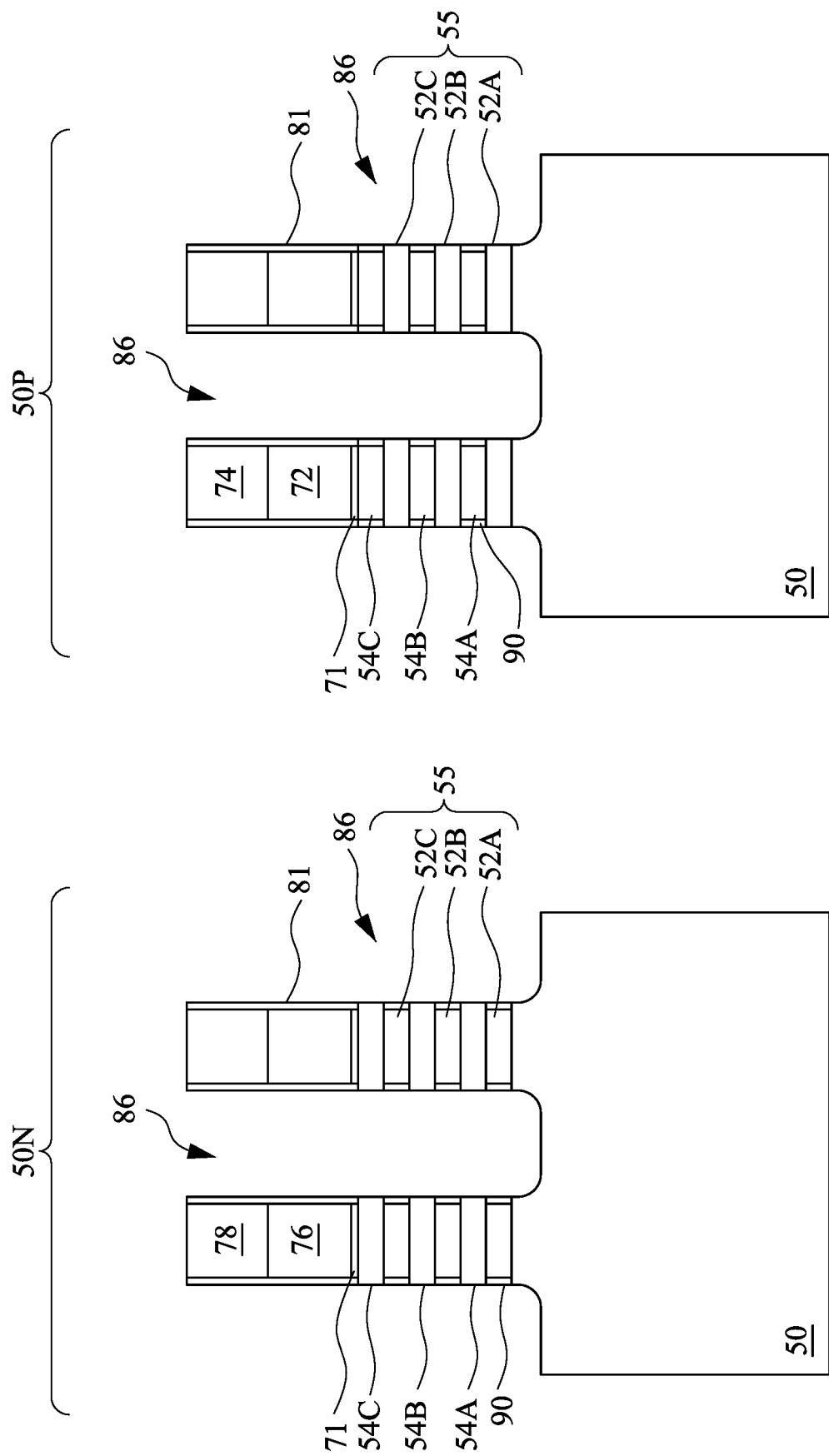
Figure 11C:
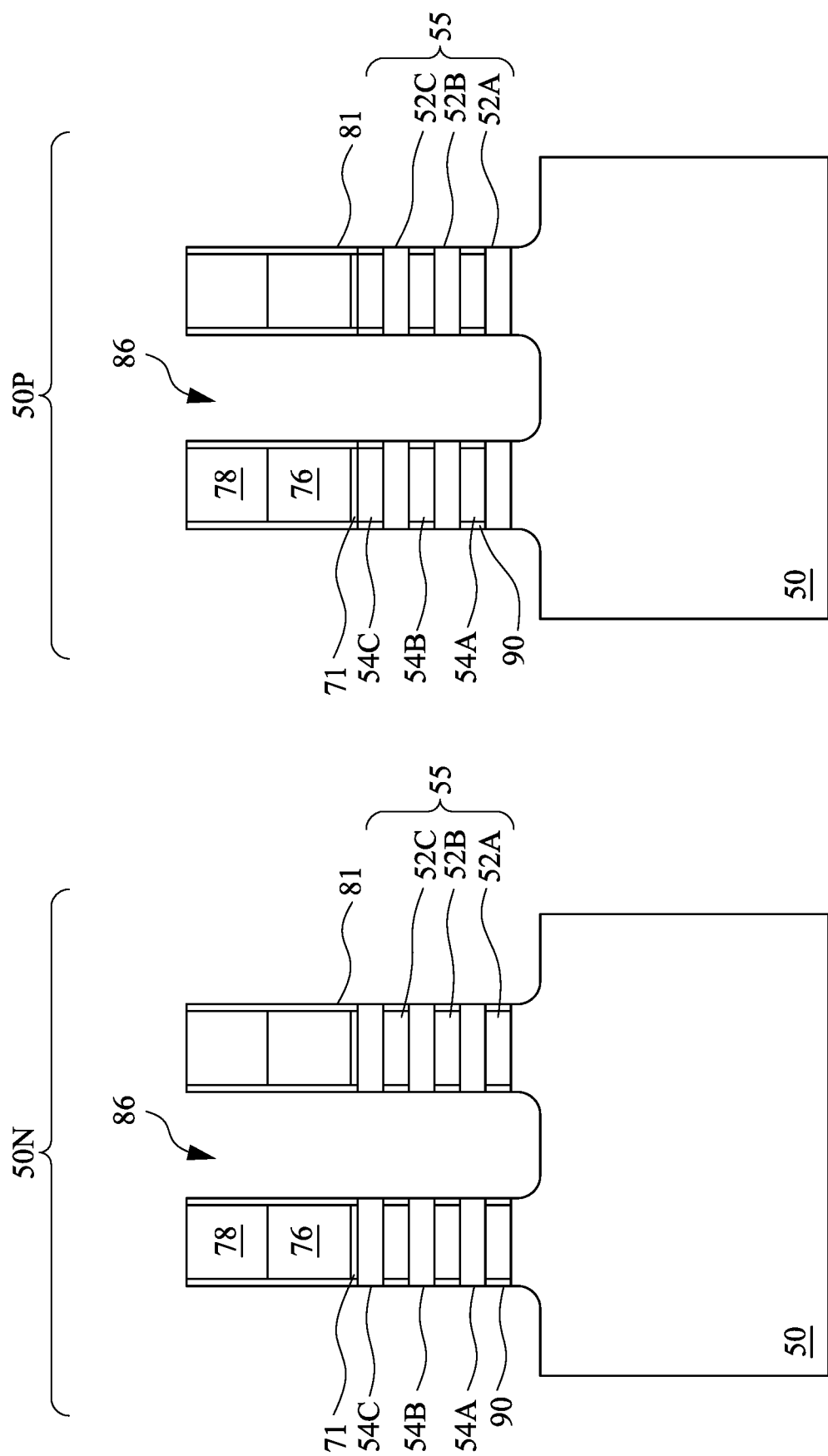

In FIGS. 11A-11C, first inner spacers 90 are formed in the sidewall recess 88. The first inner spacers 90 may be formed by depositing an inner spacer layer 264 (not separately illustrated in FIGS. 11A-11C but illustrated as an intermediate in FIG. 11I below) over the structures illustrated in FIGS. 10A and 10B. The first inner spacers 90 act as isolation features between subsequently formed source/drain regions and a gate structure. As will be discussed in greater detail below, source/drain regions will be formed in the first recesses 86, while the first nanostructures 52 in the n-type region 50N and the second nanostructures 54 in the p-type region 50P will be replaced with corresponding gate structures.

Figure 11D:
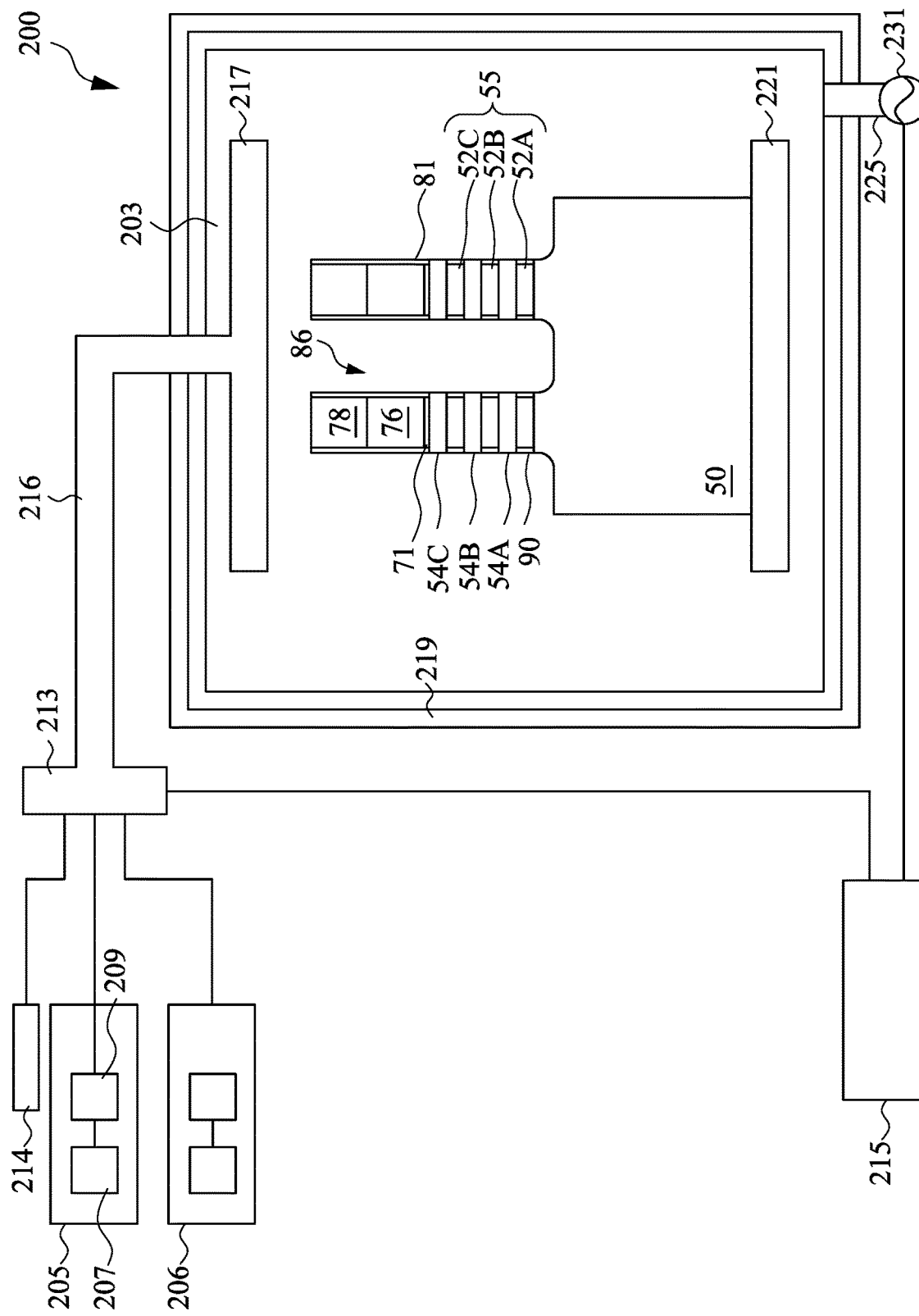
Figure 11E:
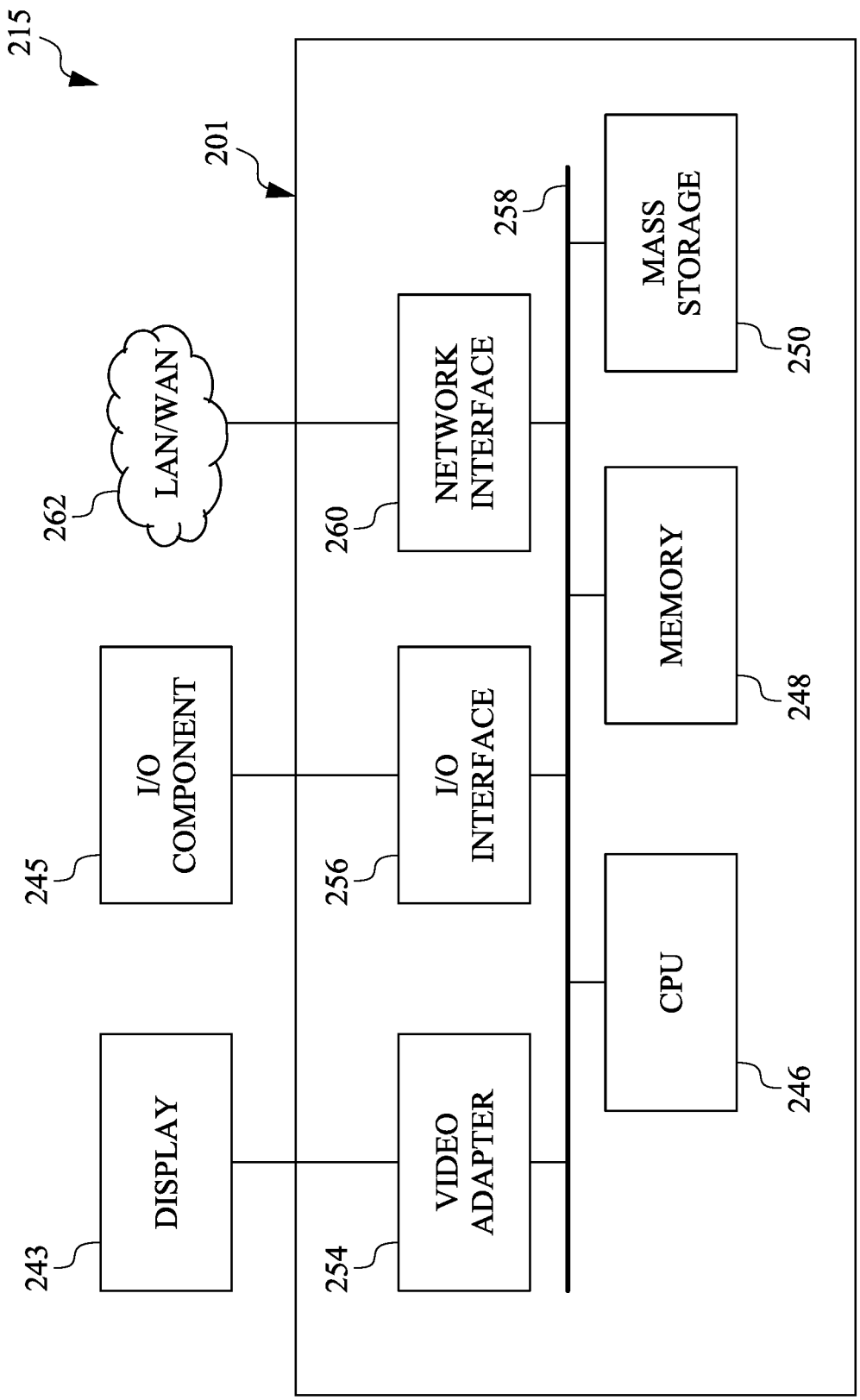

FIGS. 11D-11E illustrate a deposition system 200 that may be utilized to form the material for the inner spacer layer 264. In an embodiment the deposition system 200 comprises a deposition chamber 203 to receive precursor materials from a first precursor delivery system 205 and a second precursor delivery system 206 and form the material for the inner spacer layer 264. In an embodiment the first precursor delivery system 205 and the second precursor delivery system 206 may work in conjunction with one another to supply the various different precursor materials to a deposition chamber 203. However, the first precursor delivery system 205 and the second precursor delivery system 206 may have physical components that are similar with each other.

For example, the first precursor delivery system 205 and the second precursor delivery system 206 may each include a gas supply 207 and a flow controller 209 (labeled in FIG. 11D with regards to the first precursor delivery system 205 but not labeled for clarity with respect to the second precursor delivery system 206). In an embodiment in which the first precursor is stored in a gaseous state, the gas supply 207 may supply the first precursor to the deposition chamber 203. The gas supply 207 may be a vessel, such as a gas storage tank, that is located either locally to the deposition chamber 203 or else may be located remotely from the deposition chamber 203. In another embodiment, the gas supply 207 may be a facility that independently prepares and delivers the first precursor to the flow controller 209. Any suitable source for the first precursor may be utilized as the gas supply 207, and all such sources are fully intended to be included within the scope of the embodiments.

The gas supply 207 may supply the desired precursor to the flow controller 209. The flow controller 209 may be utilized to control the flow of the precursor to the precursor gas controller 213 and, eventually, to the deposition chamber 203, thereby also helping to control the pressure within the deposition chamber 203. The flow controller 209 may be, e.g., a proportional valve, a modulating valve, a needle valve, a pressure regulator, a mass flow controller, combinations of these, or the like. However, any suitable method for controlling and regulating the flow of the gas may be utilized, and all such components and methods are fully intended to be included within the scope of the embodiments.

However, as one of ordinary skill in the art will recognize, while the first precursor delivery system 205 and the second precursor delivery system 206 have been described herein as having identical components, this is merely an illustrative example and is not intended to limit the embodiments in any fashion. Any type of suitable precursor delivery system, with any type and number of individual components identical to or different from any of the other precursor delivery systems within the deposition system 200, may be utilized. All such precursor systems are fully intended to be included within the scope of the embodiments.

Additionally, in an embodiment in which the first precursor is stored in a solid or liquid state, the gas supply 207 may store a carrier gas and the carrier gas may be introduced into a precursor canister (not separately illustrated), which stores the first precursor in the solid or liquid state. The carrier gas is then used to push and carry the first precursor as it either evaporates or sublimates into a gaseous section of the precursor canister before being sent to the precursor gas controller 213. Any suitable method and combination of units may be utilized to provide the first precursor, and all such combination of units are fully intended to be included within the scope of the embodiments.

The first precursor delivery system 205 and the second precursor delivery system 206 may supply their individual precursor materials into a precursor gas controller 213. The precursor gas controller 213 connects and isolates the first precursor delivery system 205 and the second precursor delivery system 206 from the deposition chamber 203 in order to deliver the desired precursor materials to the deposition chamber 203. The precursor gas controller 213 may include such devices as valves, flow meters, sensors, and the like to control the delivery rates of each of the precursors, and may be controlled by instructions received from the control unit 215 (described further below with respect to FIG. 11E).

The precursor gas controller 213, upon receiving instructions from the control unit 215, may open and close valves so as to connect one or more of the first precursor delivery system 205 and the second precursor delivery system 206 to the deposition chamber 203 and direct a desired precursor material through a manifold 216, into the deposition chamber 203, and to a showerhead 217. The showerhead 217 may be utilized to disperse the chosen precursor material(s) into the deposition chamber 203 and may be designed to evenly disperse the precursor material in order to minimize undesired process conditions that may arise from uneven dispersal. In an embodiment the showerhead 217 may have a circular design with openings dispersed evenly around the showerhead 217 to allow for the dispersal of the desired precursor material into the deposition chamber 203.

However, as one of ordinary skill in the art will recognize, the introduction of precursor materials to the deposition chamber 203 through a single showerhead 217 or through a single point of introduction as described above is intended to be illustrative only and is not intended to be limiting to the embodiments. Any number of separate and independent showerheads 217 or other openings to introduce precursor materials into the deposition chamber 203 may be utilized. All such combinations of showerheads and other points of introduction are fully intended to be included within the scope of the embodiments.

The deposition chamber 203 may receive the desired precursor materials and expose the precursor materials to the structure, and the deposition chamber 203 may be any desired shape that may be suitable for dispersing the precursor materials. In the embodiment illustrated in FIG. 11D, the deposition chamber 203 has a cylindrical sidewall and a bottom. However, the deposition chamber 203 is not limited to a cylindrical shape, and any other suitable shape, such as a hollow square tube, an octagonal shape, or the like, may be utilized. Furthermore, the deposition chamber 203 may be surrounded by a housing 219 made of material that is inert to the various process materials. As such, while the housing 219 may be any suitable material that can withstand the chemistries and pressures involved in the deposition process, in an embodiment the housing 219 may be steel, stainless steel, nickel, aluminum, alloys of these, combinations of these, and like.

Within the deposition chamber 203 the substrate 50 may be placed on a mounting platform 221 in order to position and control the substrate 50 during the deposition processes. The mounting platform 221 may include heating mechanisms in order to heat the substrate 50 during the deposition processes. Furthermore, while a single mounting platform 221 is illustrated in FIG. 11D, any number of mounting platforms 221 may additionally be included within the deposition chamber 203.

Additionally, the deposition chamber 203 and the mounting platform 221 may be part of a cluster tool system (not shown). The cluster tool system may be used in conjunction with an automated handling system in order to position and place the substrate 50 into the deposition chamber 203 prior to the deposition processes, position and hold the substrate 50 during the deposition processes, and remove the substrate 50 from the deposition chamber 203 after the deposition processes.

The deposition chamber 203 may also have an exhaust outlet 225 for exhaust gases to exit the deposition chamber 203. A vacuum pump 231 may be connected to the exhaust outlet 225 of the deposition chamber 203 in order to help evacuate the exhaust gases. The vacuum pump 231, under control of the control unit 215, may also be utilized to reduce and control the pressure within the deposition chamber 203 to a desired pressure and may also be utilized to evacuate precursor materials from the deposition chamber 203 in preparation for the introduction of the next precursor material.

FIG. 11E illustrates an embodiment of the control unit 215 that may be utilized to control the precursor gas controller 213 and the vacuum pump 231 (as illustrated in FIG. 11D). The control unit 215 may be any form of computer processor that can be used in an industrial setting for controlling process machines. In an embodiment the control unit 215 may comprise a processing unit 201, such as a desktop computer, a workstation, a laptop computer, or a dedicated unit customized for a particular application. The control unit 215 may be equipped with a display 243 and one or more input/output components 245, such as instruction outputs, sensor inputs, a mouse, a keyboard, printer, combinations of these, or the like. The processing unit 201 may include a central processing unit (CPU) 246, memory 248, a mass storage device 250, a video adapter 254, and an I/O interface 256 connected to a bus 258.

The bus 258 may be one or more of any type of several bus architectures including a memory bus or memory controller, a peripheral bus, or video bus. The CPU 246 may comprise any type of electronic data processor, and the memory 248 may comprise any type of system memory, such as static random access memory (SRAM), dynamic random access memory (DRAM), or read-only memory (ROM). The mass storage device 250 may comprise any type of storage device configured to store data, programs, and other information and to make the data, programs, and other information accessible via the bus 258. The mass storage device 250 may comprise, for example, one or more of a hard disk drive, a magnetic disk drive, or an optical disk drive.

The video adapter 254 and the I/O interface 256 provide interfaces to couple external input and output devices to the processing unit 201. As illustrated in FIG. 11E, examples of input and output devices include the display 243 coupled to the video adapter 254 and the I/O component 245, such as a mouse, keyboard, printer, and the like, coupled to the I/O interface 256. Other devices may be coupled to the processing unit 201, and additional or fewer interface cards may be utilized. For example, a serial interface card (not shown) may be used to provide a serial interface for a printer. The processing unit 201 also may include a network interface 260 that may be a wired link to a local area network (LAN) or a wide area network (WAN) 262 and/or a wireless link.

It should be noted that the control unit 215 may include other components. For example, the control unit 215 may include power supplies, cables, a motherboard, removable storage media, cases, and the like. These other components, although not shown in FIG. 11E, are considered part of the control unit 215.

The deposition system 200 may be utilized to deposit the inner spacer layer 264. In an embodiment the inner spacer layer 264 may be a dielectric material such as SiCN, silicon nitride, or SiCON, although any suitable material, such as low-dielectric constant (low-k) materials having a k-value less than about 3.5, may be utilized. Additionally, the material of the inner spacer layer 264 may be a hybrid film comprising one or more of the dielectric materials. The dielectric material may be deposited using atomic layer deposition (ALD), although any other suitable deposition process, such as chemical vapor deposition, may also be used.

In an embodiment in which the desired dielectric material is SiCN formed through atomic layer deposition, the formation of the inner spacer layer 264 may be initiated by putting a first precursor material into the first precursor delivery system 205. For example, in an embodiment in which the desired dielectric material is desired to be a material such as silicon carbon nitride, the first precursor may be a material such as ammonia ($NH_3$), $N_2H_2$, or $N_2$. However, any suitable first precursor may be utilized.

Additionally, a second precursor material may be placed into the second precursor delivery system 206. In an embodiment the second precursor material is a material that can work in conjunction with the product of the first precursor material to form a monolayer of the desired material. In an embodiment in which the inner spacer layer 264 is desired to be silicon carbon nitride and the first precursor material is ammonia, the second precursor material may be a material such as trichloro[(trichlorosilyl)methyl]silane, dichlorosilane (DCS) or hexachlorodisilane (HCD). However, any suitable material may be utilized.

Once the first precursor material and the second precursor material have been placed into the first precursor delivery system 205 and the second precursor delivery system 206, respectively, the formation of the inner spacer layer 264 may be initiated by the control unit 215 sending an instruction to the precursor gas controller 213 to connect the first precursor delivery system 205 to the deposition chamber 203. Once connected, the first precursor delivery system 205 can deliver the first precursor material to the showerhead 217 through the precursor gas controller 213 and the manifold 216. The showerhead 217 can then disperse the first precursor material into the deposition chamber 203, wherein the first precursor material can be adsorbed and react with each with the exposed surfaces.

In the embodiment to form a layer of silicon carbon nitride, the first precursor material may be flowed into the deposition chamber 203 at a flow rate of between about 0.2 sccm and about 5 slm, with a carrier gas flow rate of between about 0.2 sccm and about 1 slm. Additionally, the deposition chamber 203 may be held at a pressure of between about 0.5 torr and about 10 torr, and a temperature of between about 500° C. and about 650° C. The process of an ALD cycle may continue for a time period of between about 3 s and about 60 s. However, as one of ordinary skill in the art will recognize, these process conditions are only intended to be illustrative, as any suitable process conditions may be utilized while remaining within the scope of the embodiments.

FIG. 11F illustrates that, in the embodiment in which a layer of silicon carbon nitride is desired to be formed using ammonia, under these process conditions the ammonia will react with the exposed surfaces in order to provide a surface wherein nitrogen is chemically bonded to the underlying surface while the opposite surface is terminated with hydrogen atoms which are exposed to the ambient atmosphere within the deposition chamber 203. Additionally, the reaction of the ammonia with the underlying structures will be self-limiting, providing a single layer of molecules once this step is completed.

After the self-limiting reaction has finished, the deposition chamber 203 may be purged of the first precursor material. For example, the control unit 215 may instruct the precursor gas controller 213 to disconnect the first precursor delivery system 205 (containing the first precursor material to be purged from the deposition chamber 203) and to connect a purge gas delivery system 214 to deliver a purge gas to the deposition chamber 203. In an embodiment the purge gas delivery system 214 may be a gaseous tank or other facility that provides a purge gas such as nitrogen, argon, xenon, or other gas to the deposition chamber 203, for a purge flow of between about 2 slm and about 20 slm, such as about 10 slm for a time period of between about 0.01 s and about 30 s, such as about 1 second. Additionally, the control unit 215 may also initiate the vacuum pump 231 in order to apply a pressure differential to the deposition chamber 203 to aid in the removal of the first precursor material. The purge gas, along with the vacuum pump 231, may purge the first precursor material from the deposition chamber 203.

After the purge of the first precursor material has been completed, the introduction of the second precursor material (e.g., trichloro[(trichlorosilyl)methyl]silane) to the deposition chamber 203 may be initiated by the control unit 215 sending an instruction to the precursor gas controller 213 to disconnect the purge gas delivery system 214 and to connect the second precursor delivery system 206 (containing the second precursor material) to the deposition chamber 203. Once connected, the second precursor delivery system 206 can deliver the second precursor material to the showerhead 217. The showerhead 217 can then disperse the second precursor material into the deposition chamber 203.

In the embodiment discussed above to form a layer of silicon carbon nitride with trichloro[(trichlorosilyl)methyl] silane and ammonia, the trichloro[(trichlorosilyl)methyl] silane may be introduced into the deposition chamber 203 at a flow rate of between about 0.2 sccm and about 5 slm, for about 20 seconds. Additionally, the deposition chamber 203 may be held at a pressure of between about 0.5 torr and about 5 torr, and at a temperature of between about 500° C. and about 650° C. However, as one of ordinary skill in the art will recognize, these process conditions are only intended to be illustrative, as any suitable process conditions may be utilized while remaining within the scope of the embodiments.

FIG. 11G illustrates that, in the embodiment in which a layer of silicon carbon nitride is desired to be formed using ammonia, under these process conditions the trichloro [(trichlorosilyl)methyl]silane will react with the exposed surfaces in order to provide a surface wherein silicon is chemically bonded to the underlying surface while the opposite surface is terminated with chlorine atoms which are exposed to the ambient atmosphere within the deposition chamber 203. Additionally, the reaction of the trichloro [(trichlorosilyl)methyl]silane with the underlying structures will be self-limiting, providing a single layer of molecules once this step is completed.

FIG. 11H illustrates that, after the monolayer of the desired material, e.g., silicon carbon nitride, has been formed, the deposition chamber 203 may be purged (leaving behind the monolayer of the desired material on the substrate 50) using, e.g., a purge gas from the purge gas delivery system 214 for about one second. After the deposition chamber 203 has been purged, a first cycle for the formation of the desired material has been completed, and a second cycle similar to the first cycle may be started. For example, the repeated cycle may introduce the first precursor material, purge with the purge gas, pulse with the second precursor, and purge with the purge gas.

As can be seen, each cycle of the first precursor material and the second precursor material can deposit another layer of SiCN. Additionally, each cycle additionally resets the exposed surface so that the exposed surface is prepared to receive the next cycle of the first precursor material or the second precursor material. These cycles may be repeated between about 30 times and about 100 times to form the inner spacer layer 264 to a thickness of between about 20 and about 60 Å.

Optionally, once the material of the inner spacer layer 264 has been formed, or at any suitable time between the cycles, a cleaning gas may be introduced over the material of the inner spacer layer 264. In an embodiment the cleaning gas may be a dry gas such as hydrogen fluoride (HF). The cleaning process may be performed at a temperature of about 100° C. However, any suitable cleaning gas and process conditions may be utilized.

Figure 11I:
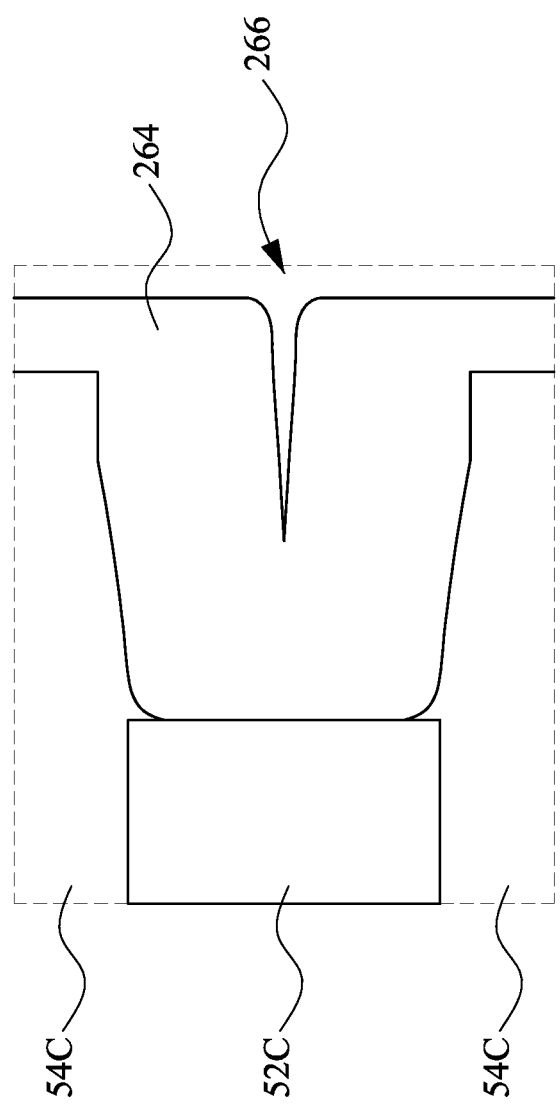

FIG. 11I illustrates a close-up view of the inner spacer layer 264 as it extends into the sidewall recesses 88 between adjacent layers of the second nanostructures 54C and makes contact with the first nanostructures 52C which have been recessed (see, e.g., FIGS. 10A-10B). As can be seen, the deposition process will grow from each of the exposed surfaces of the second nanostructures 54C and the first nanostructures 52C to mostly fill the sidewall recesses 88. However, the deposition process may also not fill the sidewall recesses 88 completely, leaving a void or seam 266 within the material of the inner spacer layer 264, which seam 266 can extend into the sidewall recesses 88. If left alone, etchants from subsequent etching processes (described further below) will enter the seam 266 and cause undesirable etching, which can lead to defects and a reduction in yield.

Figure 12A:
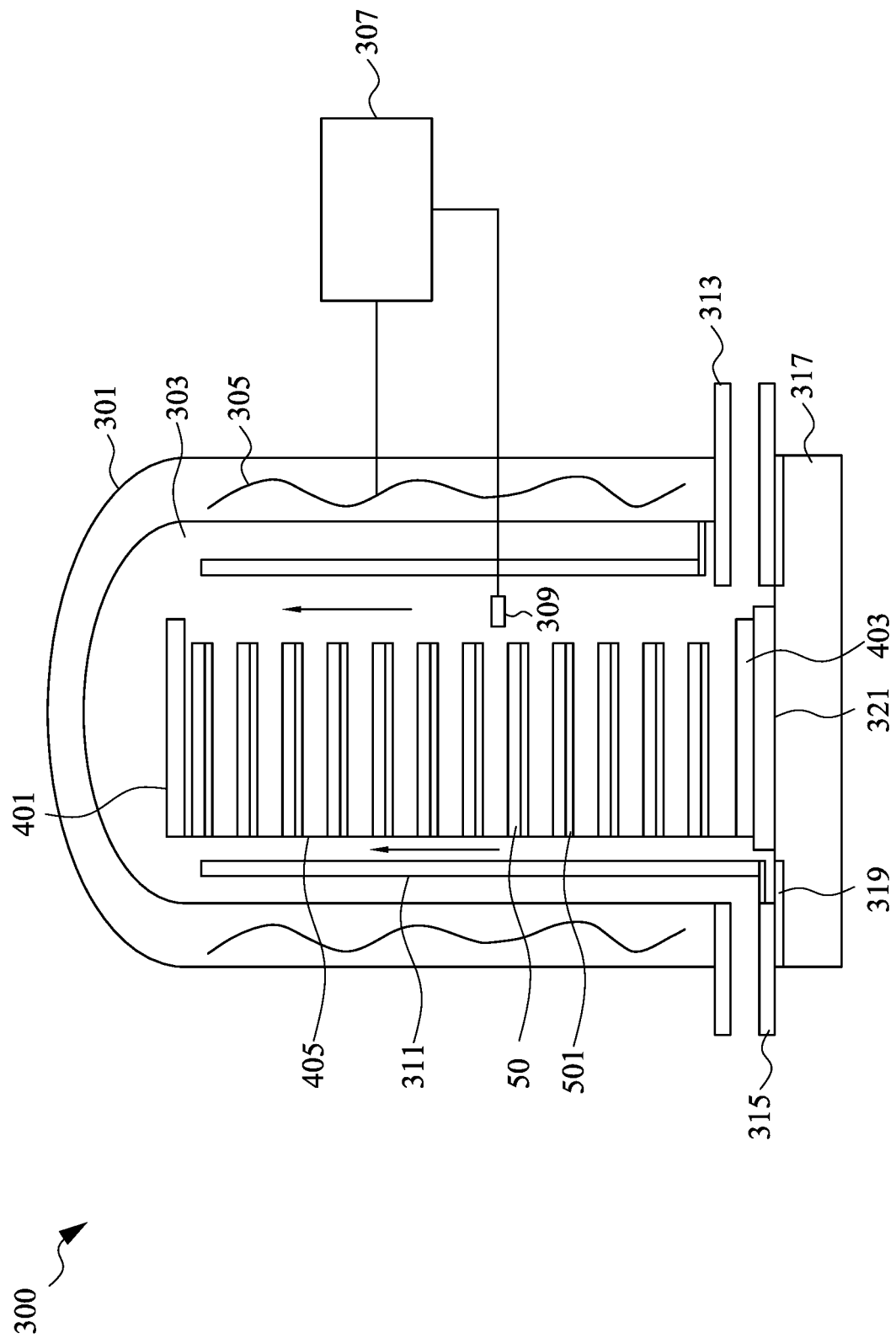

To help ameliorate these effects, FIG. 12A illustrates a furnace 300 that may be utilized to perform a first annealing process after the inner spacer layer 264 has been deposited. The furnace 300 may comprise an external body 301 that encloses a central cavity 303. The external body 301 may be shaped as a cylinder with a closed upper end and an open lower end to allow for the introduction and removal of plurality of the substrates 50 (e.g., as part of a semiconductor wafer) into and out of the furnace 300. The external body 301 of the furnace may be formed from a heat-resistant material such as quartz, silicon-carbide, mullite, combinations of these, or the like in order to retain and redirect thermal energy towards the central cavity 303.

Within the external body 301 a series of heaters 305 controlled by a controller 307 are located. The series of heaters 305 may be utilized to control the temperature within the central cavity 303 and to heat the substrates 50 as they reside within the central cavity 303. In an embodiment the heaters 305 may be resistive heaters, although any suitable type of heater, such as radiative heaters using steam, radiative heaters using a burning hydrocarbon, or any other suitable element for transferring heat, may be utilized.

The controller may be, e.g., a computer with a processor, memory, and input/output ports utilized to run a control program to control the heat within the furnace 300. Additionally, the controller 307 may have one or more temperature sensors 309 in order to provide heating information to the controller 307. The temperature sensors 309 may be, e.g., a thermocouple installed within the central cavity 303 to monitor the temperature of the central cavity 303 and adjust the series of heaters 305 accordingly to obtain and maintain the desired annealing temperature. However, any suitable type of sensor may be utilized to measure the temperature of the central cavity 303 and transmit that measurement to the controller 307.

An inner tube 311 may be placed within the external body 301 and encircling the central cavity 303. The inner tube 311 may a material such as, e.g., quartz, silicon carbide, or mullite. The inner tube 311 may be cylindrical in shape and spaced apart from the external body 301 in order to provide a passage between the inner tube and the external body 301 for process gases to flow.

Inlets 313 and exits 315 may extend through the external body 301 to provide entrance and exit points for ambient gases to pass into and out of the central cavity 303. The inlets 313 may extend into a bottom region of the central cavity 303 in order to provide fresh ambient gases into the central cavity 303. The exits 315 may only extend through the external body 301, such that the exits 315 open into the spacing between the external body 301 and the inner tube 311. By placing the inlets 313 and the exits 315 at these locations, the desired ambient gases may be introduced at the bottom of the central cavity 303, flow upwards through the central cavity 303 within the inner tube 311, flow over the ends of the inner tube 311, down through the spacing between the inner tube 311 and the external body 301, and out through the exits 315. Optionally, a vacuum pump (not individually illustrated in FIG. 12A) may be attached to the exits 315 in order to facilitate the removal of the ambient gases from the central cavity 303.

To seal the central cavity 303 from the ambient atmosphere, a base plate 317 may be attached to the external body 301 along the bottom of the external body 301. The base plate 317 may be made from a similar material as the external body 301 (e.g., quartz, silicon carbide, mullite, combinations of these, or the like) and covers the opening at the bottom of the external body 301. A seal ring 319 may be utilized to hermetically seal the central cavity 303 between the external body 301 and the base plate 317.

Attached to the base plate 317 may be a wafer boat connection platform 321. The wafer boat connection platform 321 allows for the placement and connection of a wafer boat 400 to the base plate 317. Once attached to the base plate 317, the wafer boat 400 may be placed into the central cavity 303 and be ready for processing.

FIG. 12A additionally illustrates a wafer boat 400 that may be utilized to insert and remove semiconductor wafers such as the substrate 50 from the furnace 300. The wafer boat 400 may comprise a top plate 401, a bottom plate 403, and a plurality of support posts 405 extending between the top plate 401 and the bottom plate 403. The top plate 401, the bottom plate 403, and the support posts 405 may all be made from a heat resistant material such as quartz, silicon carbide, mullite, combinations of these, or the like, and the support posts 405 may be attached to the top plate 401 and the bottom plate 403 through a suitable heat resistant method, such as bolting, welding, heat-resistant adhesives, force fits, combinations of these, or the like.

A series of notches may be formed at regular intervals along the support posts 405 to allow the support posts 405 to support the substrates 50. Each notch in one of the support posts 405 may be aligned with notches at a similar height in the other support posts 405, thereby providing four support points at each height to support the substrates 50 and other wafers. The notches may be spaced apart from each other enough to allow the heat from the furnace to evenly heat the semiconductor wafers without significant interference from adjacent wafers within the wafer boat 400, such as about 6.3 mm apart.

In an embodiment the wafer boat 400 may have four support posts 405, with each support post 405 comprising 143 notches. However, the precise number of support posts 405, the placement of the support posts 405, and the number of notches within the support posts may be varied beyond the embodiments described herein. All such variations are fully intended to be included within the scope of the embodiments.

The substrate 50 (along with other substrates 50 which may be desired to be processed simultaneously) may be placed into the wafer boat 400 after the substrate 50 has been placed onto a support ring 501 and aligned. This placement may be performed automatically, and the alignment of the substrate 50 may be maintained by the frictional forces between the substrate 50 and the support ring 501.

FIG. 12A also illustrates that, once all of the substrates 50 have been placed into the wafer boat 400, the wafer boat 400 (along with the substrates 50) may be placed onto the wafer boat connection platform 321 on the base plate 317 while the base plate 317 is separated from the external body 301 of the furnace 300. Optionally, the wafer boat 400 may be physically attached to the wafer boat connection platform 321 using, e.g., clamps or other suitable connection devices.

After the wafer boat 400 has been placed on the wafer boat connection platform 321 of the base plate 317, the base plate 317 may be mated with the external body 301 such that the wafer boat 400 and the substrates 50 are located within the central cavity 303 of the furnace 300. Once the central cavity 303 is hermetically sealed between the external body 301 and the base plate 317, the controller 307 may engage the heaters 305 to begin heating the central cavity 303 while desired ambient gases may be funneled into the central cavity 303 through the inlets 313, over the wafer boat 400 and the substrate 50, and out through the exits 315.

In an embodiment the desired ambient gases (without plasma) may be chosen in order to help a portion of the inner spacer layer 264 (e.g., SiCN) both convert to an oxide (e.g., SiOCN) and well as expand in order to help reduce or close any seams 266 that may have formed during the deposition process. As such, in an embodiment the ambient gases may include an oxidizer, a regenerator, and a catalyst. For example, in some embodiments the oxidizer may be an oxygen containing gas such as water ($H_2O$), oxygen, or ozone. However, any suitable oxidizer may be utilized.

In order to introduce the oxidizer, a carrier gas such as argon, helium, N2, combinations of these, or the like, may be bubbled through a liquid of the oxidizer. A portion of the liquid will vaporize and then be carried by the carrier gas to one or more of the inlets 313 (e.g., one 1.0 mm injector for each ambient). In an embodiment the oxidizer may have a flow rate into the furnace 300 of between about 0.5 slm and about 5 slm while the carrier gas has a flow rate into the furnace of about 0.5 slm and about 3 slm. However, any suitable methods of introducing the oxidizer and any suitable flow rates may be utilized.

The regenerator may be used to help prevent an overall reduction of material caused by undesired etching of the material of the inner spacer layer 264. For example, in some embodiments in which the annealing process also works to etch and remove some of the material from the inner spacer layer 264, the regenerator may be used to replace the removed material and regenerate the inner spacer layer 264. As such, in some embodiments the regenerator may be the second precursor (e.g., trichloro[(trichlorosilyl)methyl]silane), DCS, HCD, combinations of these, or the like. However, any suitable regenerator may be utilized.

In order to introduce the regenerator, a carrier gas such as argon, helium, N2, combinations of these, or the like, may also be bubbled through a liquid of the regenerator. A portion of the liquid will vaporize and then be carried by the carrier gas to one or more of the inlets 313. In an embodiment the regenerator may have a flow rate into the furnace 300 of between about 0.5 slm and about 5 slm while the carrier gas has a flow rate into the furnace of about 0.5 slm and about 3 slm. However, any suitable methods of introducing the regenerator and any suitable flow rates may be utilized.

The catalyst may be supplied in order to help with the chemical reactions that are desired to occur within the furnace 300. As such, while the precise catalyst chosen is dependent at least in part on the material of the inner spacer layer 264, the oxidizer, and the regenerator, in some embodiments the catalyst may be a chemical such as pyridine or the like. However, any suitable catalyst may be utilized.

In order to introduce the catalyst, a carrier gas such as argon, helium, nitrogen, water, oxygen, combinations of these, or the like, may be bubbled through a liquid of the catalyst. A portion of the liquid will vaporize and then be carried by the carrier gas to one or more of the inlets 313. In an embodiment the catalyst may have a flow rate into the furnace 300 of between about 0.5 slm and about 5 slm while the carrier gas has a flow rate into the furnace of about 0.5 slm and about 3 slm. However, any suitable methods of introducing the catalyst and any suitable flow rates may be utilized.

Additionally, while the use of a bubbler has been described above with respect to the vaporizing of the oxidizer, the regenerator, and the catalyst, this is merely intended to be illustrative and is not intended to limit the present embodiments. Rather, any suitable vaporizer may be used to vaporize and transport the oxidizer, the regenerator, and the catalyst from storage to be used within the furnace 300. All such vaporizers are fully intended to be included within the scope of the embodiments.

FIG. 12A additionally illustrates one suitable process whereby the heat within the central cavity 303 is transferred to the substrates 50 in a first annealing process, thereby annealing the substrates 50 and the material of the inner spacer layer 264 located on the substrates 50. In an embodiment the first annealing process may be performed at a temperature of between about 400° C. and about 600° C., such as about 450° C.; a pressure of between about 500 torr and 800 torr; and for a time of between about 1 hour and about 6 hours, such as about 4 hours. However, any suitable parameters may be utilized.

Figure 12B:
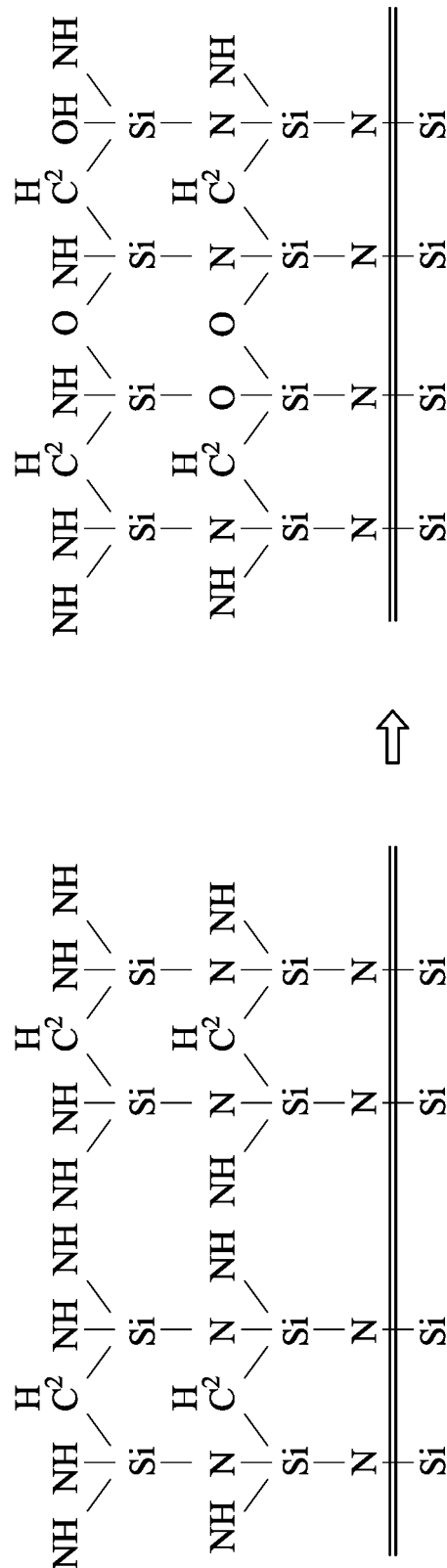

FIG. 12B illustrates a conversion of the material of the inner spacer layer 264 to include oxygen from the oxidizer during the annealing process. In particular, as the annealing process introduces the oxidizer to the material of the inner spacer layer 264, the oxidizer will react with the material of the inner spacer layer 264 and will introduce oxygen into the material of the inner spacer layer 264. As such, in an embodiment in which the material of the inner spacer layer 264 is SiCN, a portion of the inner spacer layer 264 may be converted to an oxide such as SiOCN. However, any suitable materials may be used.

Figure 12C:
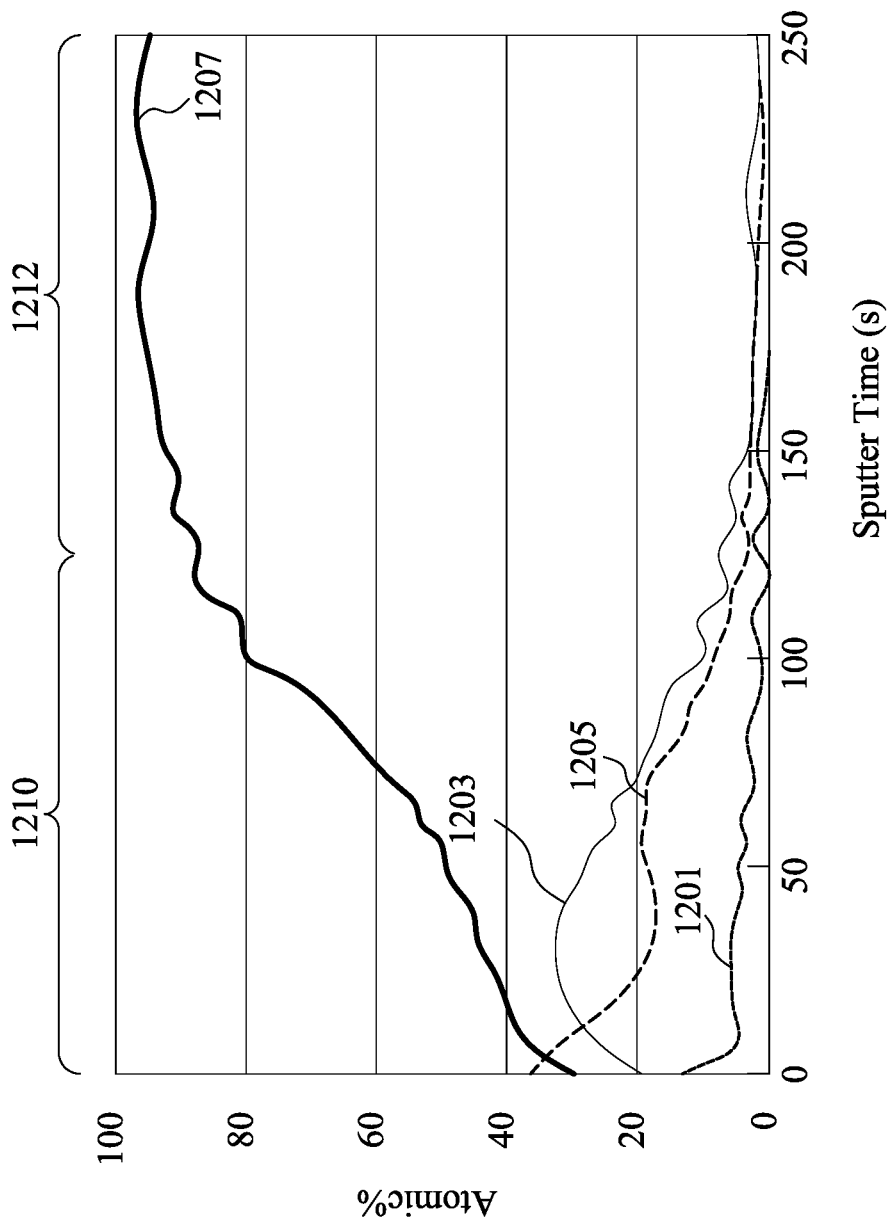

FIG. 12C illustrates a chart which illustrate the atomic percentage of carbon (represented in FIG. 12C by the line labeled 1201), nitrogen (represented in FIG. 12C by the line labeled 1203), oxygen (represented in FIG. 12C by the line labeled 1205), and silicon (represented in FIG. 12C by the line labeled 1207). As can be seen, by introducing the oxygen into the material of the inner spacer layer 264, the introduction will cause both diffusion as well as reaction, the material of the inner spacer layer 264 will form two distinct regions within the material of the inner spacer layer 264. In a particular embodiment, the material of the inner spacer layer 264 will have an oxide rich region 1210 along a surface of the material (that portion that converted to the oxide), which then has an oxygen gradient until the material of the inner spacer layer 264 will also have an oxide less region 1212 in its bulk (that portion to which the oxygen did not reach during the annealing process).

In an embodiment the oxide rich region 1210 may have an oxygen percentage of between about 10% and about 50%, such as about 30%. Additionally, the oxide rich region 1210 may have a nitrogen percentage of between about 5% and about 50%, such as about 5%. In a particular embodiment the oxide rich region 1210 may have a atomic percentage of silicon of about 31%, an atomic percentage of carbon of about 4%, an atomic percentage of oxygen of about 41%, and an atomic percentage of nitrogen of about 23%. As such, the oxide rich region 1210 may extend from the expanded surface of the inner spacer layer 264 between about 15 Å and about 27 Å (for 39% of the overall thickness), while the oxide-less region has a thickness of between about 30 A and about 42 Å (or the remaining 61% of the overall thickness). Additionally, the annealing process can deplete the nitrogen within the oxide rich region 1210 from about 57% (as deposited) to be between about 23% to about 30%, such as about 28%, and slightly reduce the carbon concentration from about 5% (as deposited) to about 4%. However, any suitable concentrations and thicknesses may be utilized.

Figure 12D:
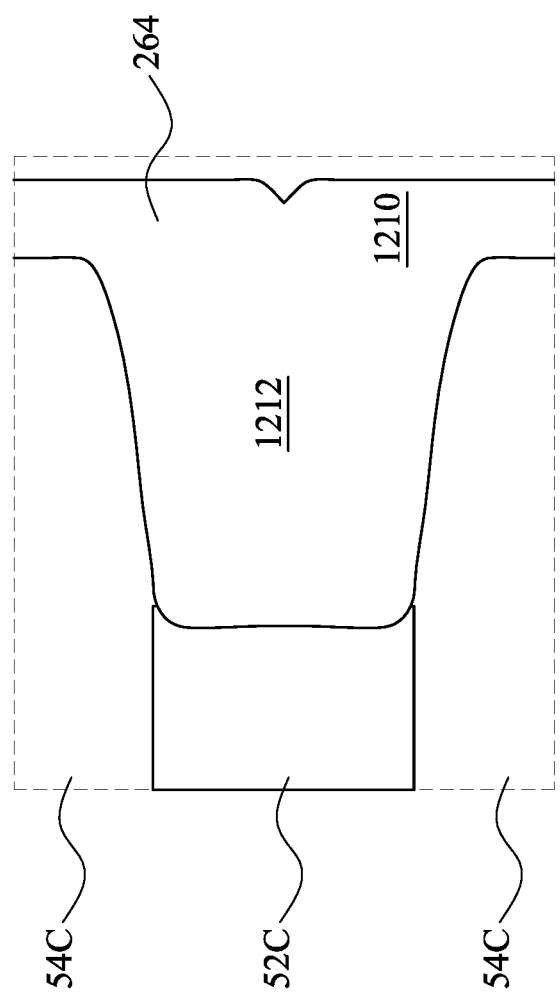

FIG. 12D illustrates that, by adding additional material (e.g., oxygen) to the material of the inner spacer layer 264, those portions of the inner spacer layer 264 which receive the additional material (e.g., the oxide rich region 1210) will expand. In some embodiments the material of the inner spacer layer 264 may expand by about 32% while achieving a k-value of about 5.

With such an expansion, the seam 266 that was previously present within the material of the inner spacer layer 264 immediately after deposition (see, e.g., FIG. 11I) can be reduced or else completely eliminated. Such closure of the seams 266 in order to present an almost planar outwardly facing surface helps prevent unwanted complications that may arise in subsequent etching processes.

For example, returning now to FIGS. 11A-11C, once the inner spacer layer 264 has been deposited and treated, the inner spacer layer 264 may then be anisotropically etched to form the first inner spacers 90. In an embodiment the etching process may be a CERTAS® etch, which introduces hydrogen fluoride (HF) and ammonia ($NH_3$) as etchants to the exposed material of the converted inner spacer material (e.g., the oxide rich region 1210). The HF and $NH_3$ may react with each other and with the oxide present in the material of the converted inner spacer material to produce $(NH_4)_2SiF_6$ on a surface of the material of the converted inner spacer material.

Additionally, as the $(NH_4)_2SiF_6$ is formed on the exposed surface of the converted inner spacer material, the $(NH_4)_2SiF_6$ will itself act as a diffusion barrier layer that will prevent the further diffusion of HF and $NH_3$ into the material of the converted inner spacer material. As such, the CERTAS® etch is effectively self-limiting, as the formation of $(NH_4)_2SiF_6$ will prevent further formation of $(NH_4)_2SiF_6$ at a deeper depth within the material of the converted inner spacer material. The precise depth to which the $(NH_4)_2SiF_6$ will form may be adjusted based on process conditions.

For example, in an embodiment the CERTAS® process conditions may be set so as to react between about 15 Å and about 150 Å, such as about 50 Å of the material of the converted inner spacer material from an oxide to $(NH_4)_2SiF_6$. This desired depth may be obtained by controlling the temperature, pressure, and flow rates of the etchants within the CERTAS® process. For example, the etching process may be performed at a temperature of between about 20° C. and about 60° C., such as about 30° C., while the pressure may be held between about 10 mTorr and about 100 mTorr, such as about 20 mTorr. Additionally, the flow rate of HF may be between about 10 sccm and about 100 sccm, such as about 20 sccm, and the flow rate of $NH_3$ may be between about 10 sccm and about 100 sccm, such as about 20 sccm. Other diluents, such as argon, xenon, helium, or other nonreactive gases, may additionally be utilized.

Once the reaction has effectively self-terminated (e.g., at a distance of 50 Å from the surface of the material of the converted inner spacer material), the material of the converted inner spacer material (along with the substrate 50) may be heated using an annealing process in order to remove the $(NH_4)_2SiF_6$, thereby reducing the thickness of the material of the converted inner spacer material by the thickness of the $(NH_4)_2SiF_6$ and also exposing a remaining portion of the material of the converted inner spacer material for further processing. The heat may cause the $(NH_4)_2SiF_6$ to thermally decompose to $N_2$, $H_2O$, $SiF_4$, and $NH_3$, all of which may be vapor and may be removed from the surface of the material of the converted inner spacer material by the annealing process. In an embodiment of the annealing process the material of the converted inner spacer material may be heated to a temperature of between about 80° C. to about 200° C., such as about 100° C. for between about 60 seconds to about 180 seconds to remove the $(NH_4)_2SiF_6$ from the surface.

After the $(NH_4)_2SiF_6$ has been removed, the material of the converted inner spacer material is again exposed and may be further processed. In an embodiment a second etching process, such as a second CERTAS® etch similar to the first CERTAS® etch described above, may be performed to controllably reduce the thickness of the material of the converted inner spacer material even further, such as reducing the material of the converted inner spacer material by another 50 Å to have a thickness of between about 15 Å and about 150 Å, such as about 120 Å. However, as one of ordinary skill in the art will recognize, the precise type of etching process, the number of iterations of the CERTAS® process, the process parameters for the etching process, and the precise thickness of the material of the converted inner spacer material as described above is intended to be illustrative only, as any number of iterations and any desired thickness of the material of the converted inner spacer material may be utilized.

The CERTAS® process may be utilized to reduce the thickness of the converted inner spacer material until the material of the converted inner spacer material is flush with sidewalls of the second nanostructures 54 in the n-type region 50N and flush with the sidewalls of the first nanostructures 52 in the p-type region 50P. For example, in embodiments in which the first inner spacers 90 are formed adjacent to silicon, the first inner spacers 90 may have a thickness of between about 4.1 nm and about 4.4 nm. In another embodiment in which the first inner spacers 90 are formed adjacent to silicon germanium, the first inner spacers 90 may have a thickness between about 9.4 nm and about 11.2 nm.

Additionally, while a very particular process is described above (the CERTAS® etch process) this description is intended to be illustrative and is not intended to be limiting. Rather, any suitable etching process may be utilized to thin the material of the converted inner spacer material. For example, in another embodiment, a reactive ion etching process followed by one or more cleaning process (e.g., an SC-1 or SC-2 cleaning process) may be utilized. All such etching processes are fully intended to be included within the scope of the embodiments.

However, although outer sidewalls of the first inner spacers 90 are illustrated as being flush with sidewalls of the second nanostructures 54 in the n-type region 50N and flush with the sidewalls of the first nanostructures 52 in the p-type region 50P, the outer sidewalls of the first inner spacers 90 may be recessed from sidewalls of the second nanostructures 54 and/or the first nanostructures 52, respectively.

Moreover, although the outer sidewalls of the first inner spacers 90 are illustrated as being straight in FIG. 11B, the outer sidewalls of the first inner spacers 90 may be concave or dished. As an example, FIG. 11C illustrates an embodiment in which outer sidewalls of the first inner spacers 90 are concave. Also illustrated are embodiments in which outer sidewalls of the first inner spacers 90 are concave.

In a particular embodiment in which the first inner spacers 90 are dished, the use of the annealing process and the reduction or removal of the seam 266, undesired dishing may be reduced or avoided completely. For example, in some embodiments in which a CERTAS® etch is utilized, the dishing may be no bigger than about 3.2 nm, for a seam FR % reduction to about 0/44. In other embodiments in which another etch followed by an SC-1/SC-2 clean is utilized, the dishing may be no bigger than 4.3 nm, for a seam fail rate percent (FR %) reduction to about 0/44. As such, the dishing may be minimized.

Figure 13A:
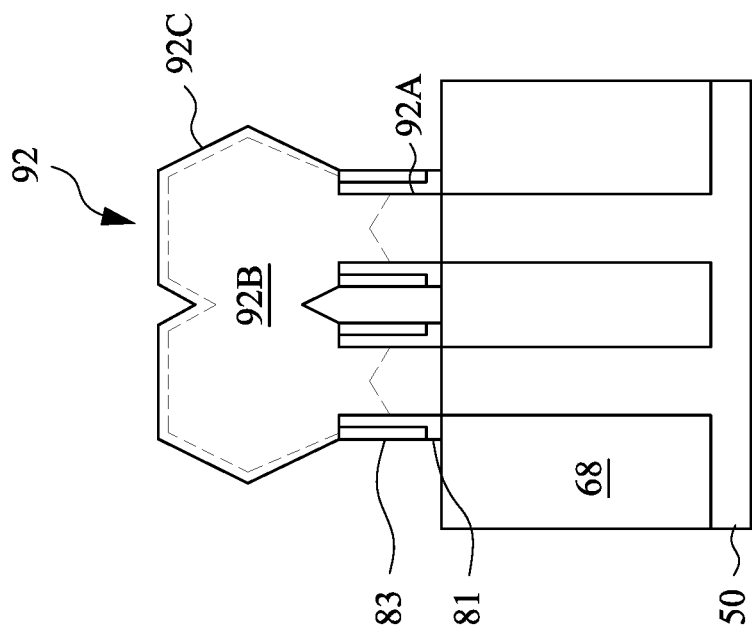
Figure 13B:
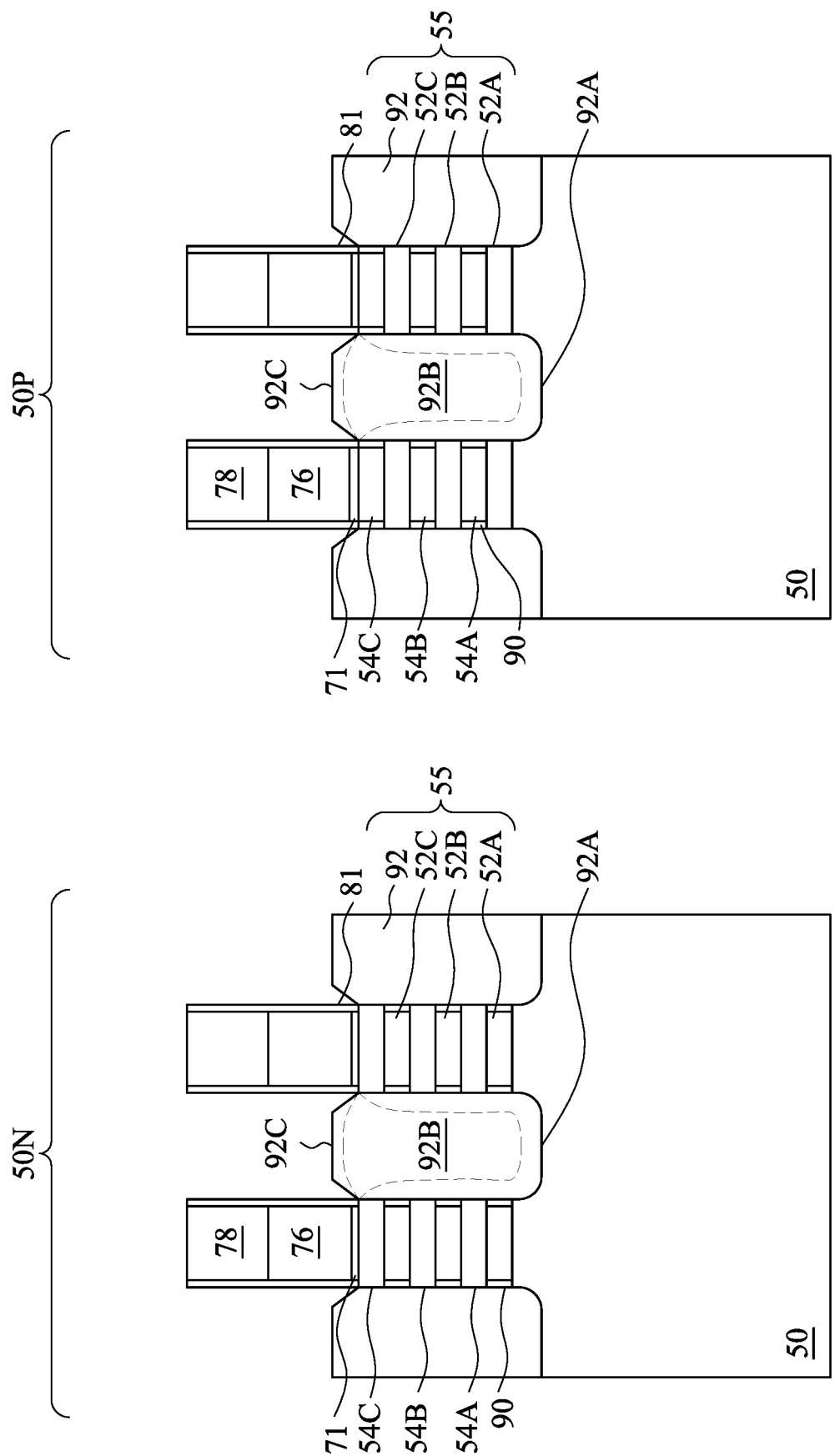

In FIGS. 13A-13C, epitaxial source/drain regions 92 are formed in the first recesses 86. In some embodiments, the epitaxial source/drain regions 92 may exert stress on the second nanostructures 54 in the n-type region 50N and on the first nanostructures 52 in the p-type region 50P, thereby improving performance. As illustrated in FIG. 13B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gate layer 72 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 56 and may have facets.

Additionally, while specific processes are describe above as ways to form the epitaxial source/drain regions 92 in the n-type region 50N and in the p-type region 50P, these descriptions are intended to be illustrative and are not intended to be limiting. Rather, any suitable process may be utilized to form the epitaxial source/drain regions 92 in the n-type region 50N and in the p-type region 50P. For example, the epitaxial source/drain regions 92 in both the n-type region 50N and in the p-type region 50P may be formed with a single material such as silicon and may be formed simultaneously (or separately) with each other. All suitable materials and processes may be utilized, and all such materials and processes are fully intended to be included within the scope of the embodiments.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an annealing. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same NSFET to merge as illustrated by FIG. 13A. In other embodiments, adjacent epitaxial source/drain regions 92 remain separated after the epitaxy process is completed as illustrated by FIG. 13C. In the embodiments illustrated in FIGS. 13A and 13C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 58.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 13D:
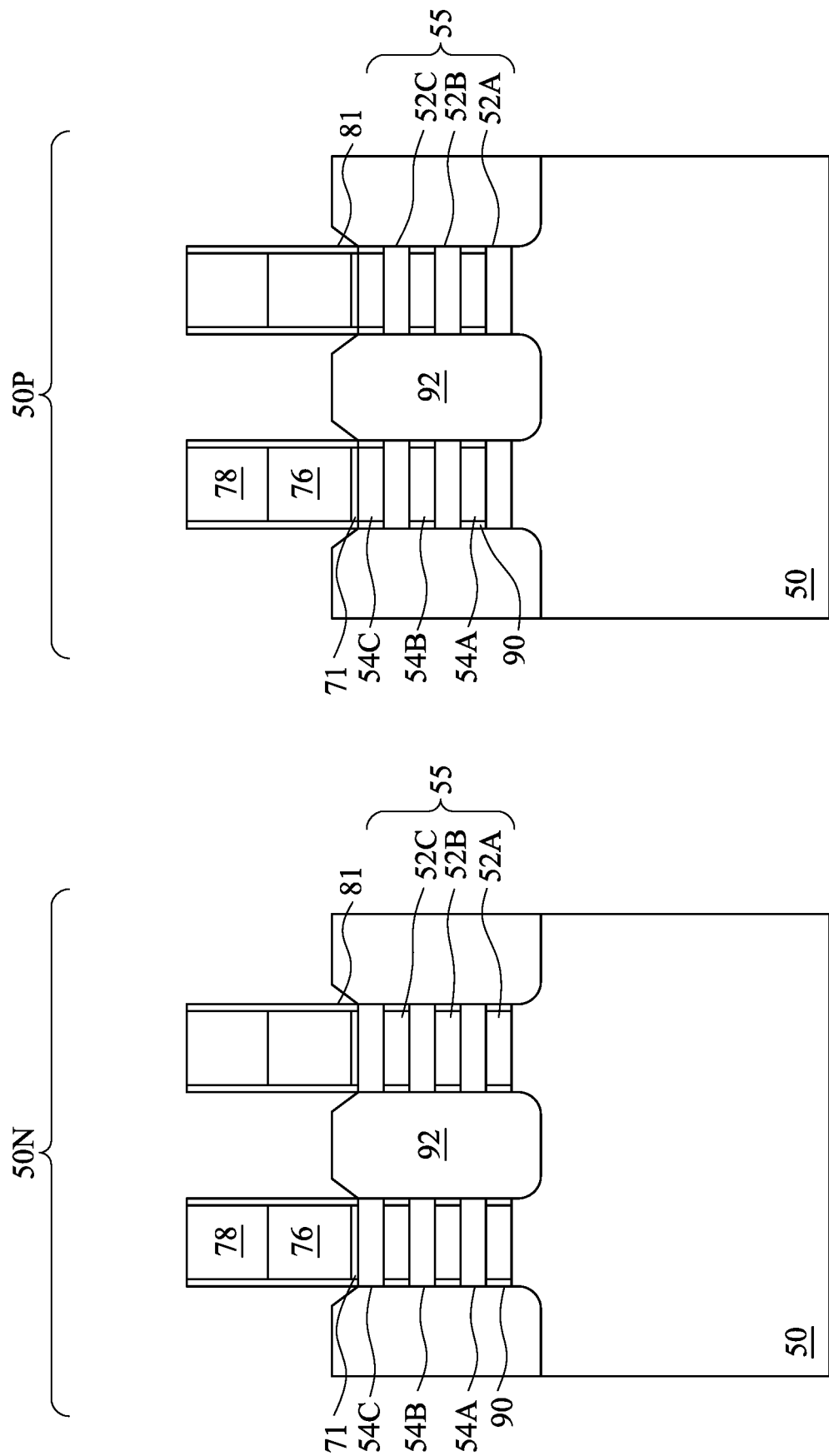

FIG. 13D illustrates an embodiment in which sidewalls of the first nanostructures 52 in the n-type region 50N and sidewalls of the second nanostructures 54 in the p-type region 50P are concave, outer sidewalls of the first inner spacers 90 are concave, and the first inner spacers 90 are recessed from sidewalls of the second nanostructures 54 and the first nanostructures 52, respectively. As illustrated in FIG. 13D, the epitaxial source/drain regions 92 may be formed in contact with the first inner spacers 90 and may extend past sidewalls of the second nanostructures 54 in the n-type region 50N and past sidewalls of the first nanostructures 52 in the p-type region 50P.

Figure 14A:
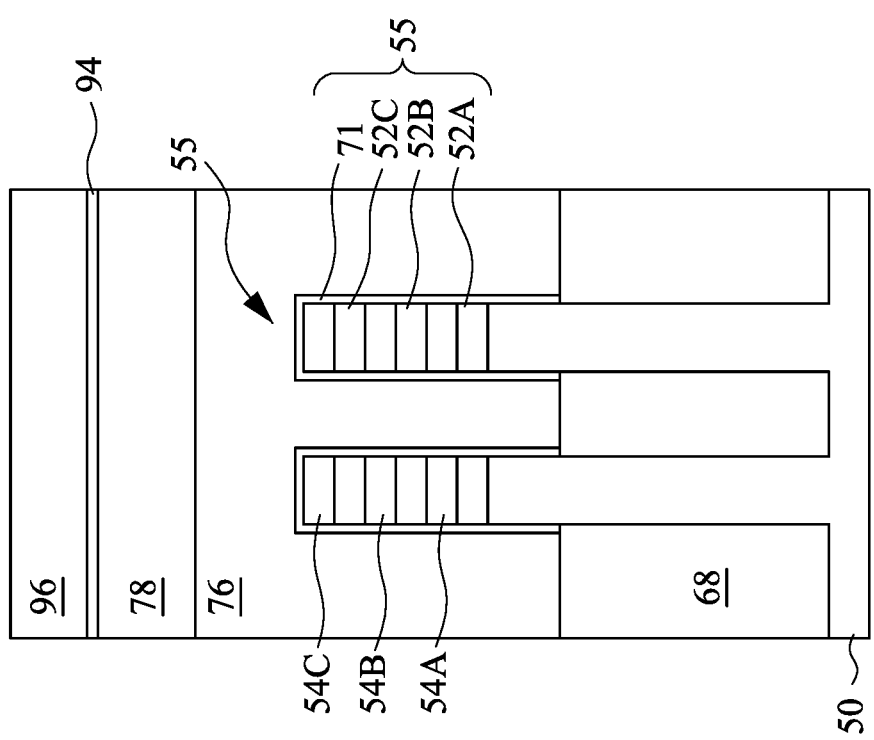
Figure 14B:
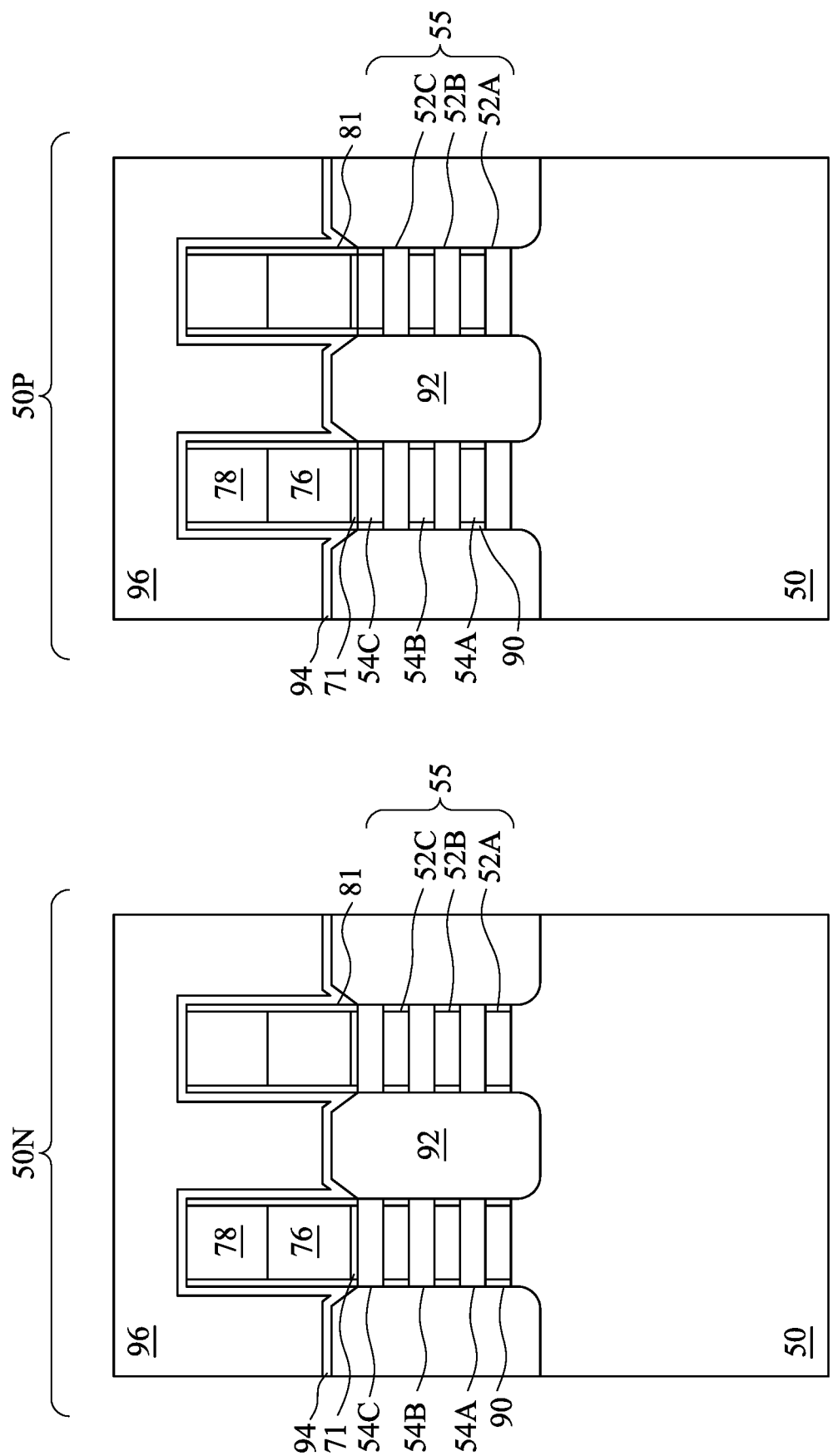
Figure 14C:
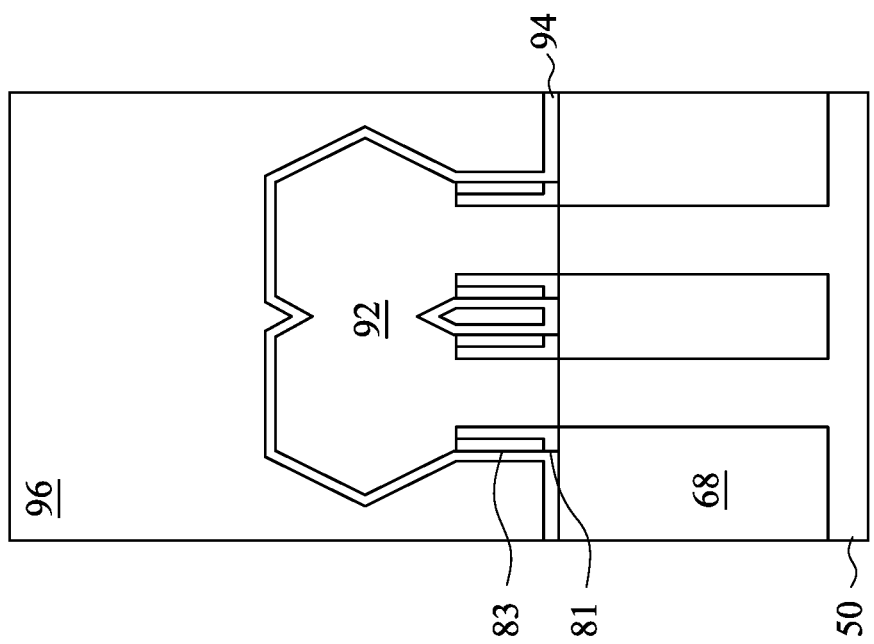

In FIGS. 14A-14C, a first interlayer dielectric (ILD) 96 is deposited over the structure illustrated in FIGS. 6A, 13B, and 13A (the processes of FIGS. 7A-13D do not alter the cross-section illustrated in FIG. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 74, and the first spacers 81. The CESL 94 may comprise a dielectric material, such as, silicon nitride, silicon oxide, silicon oxynitride, or the like, having a different etch rate than the material of the overlying first ILD 96.

Figure 15A:
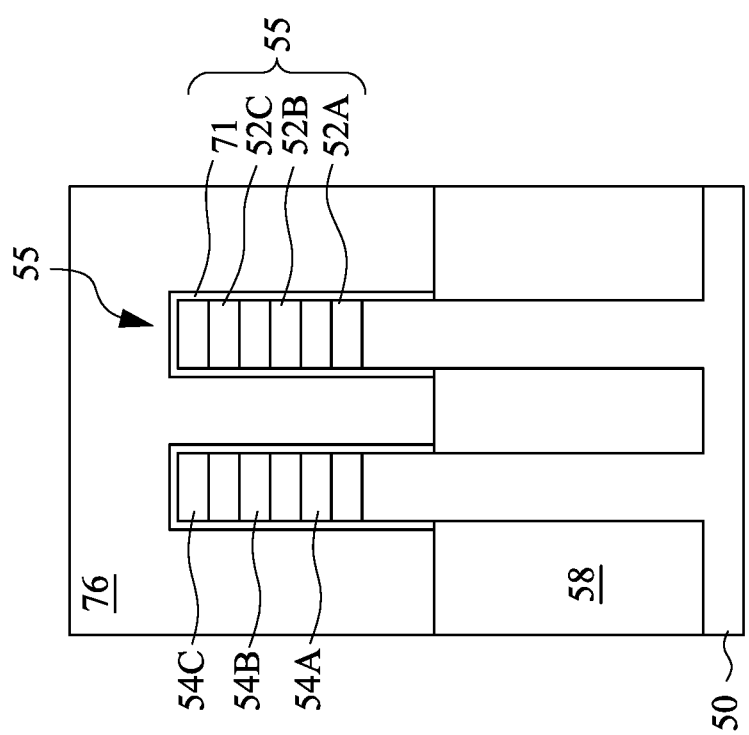
Figure 15B:
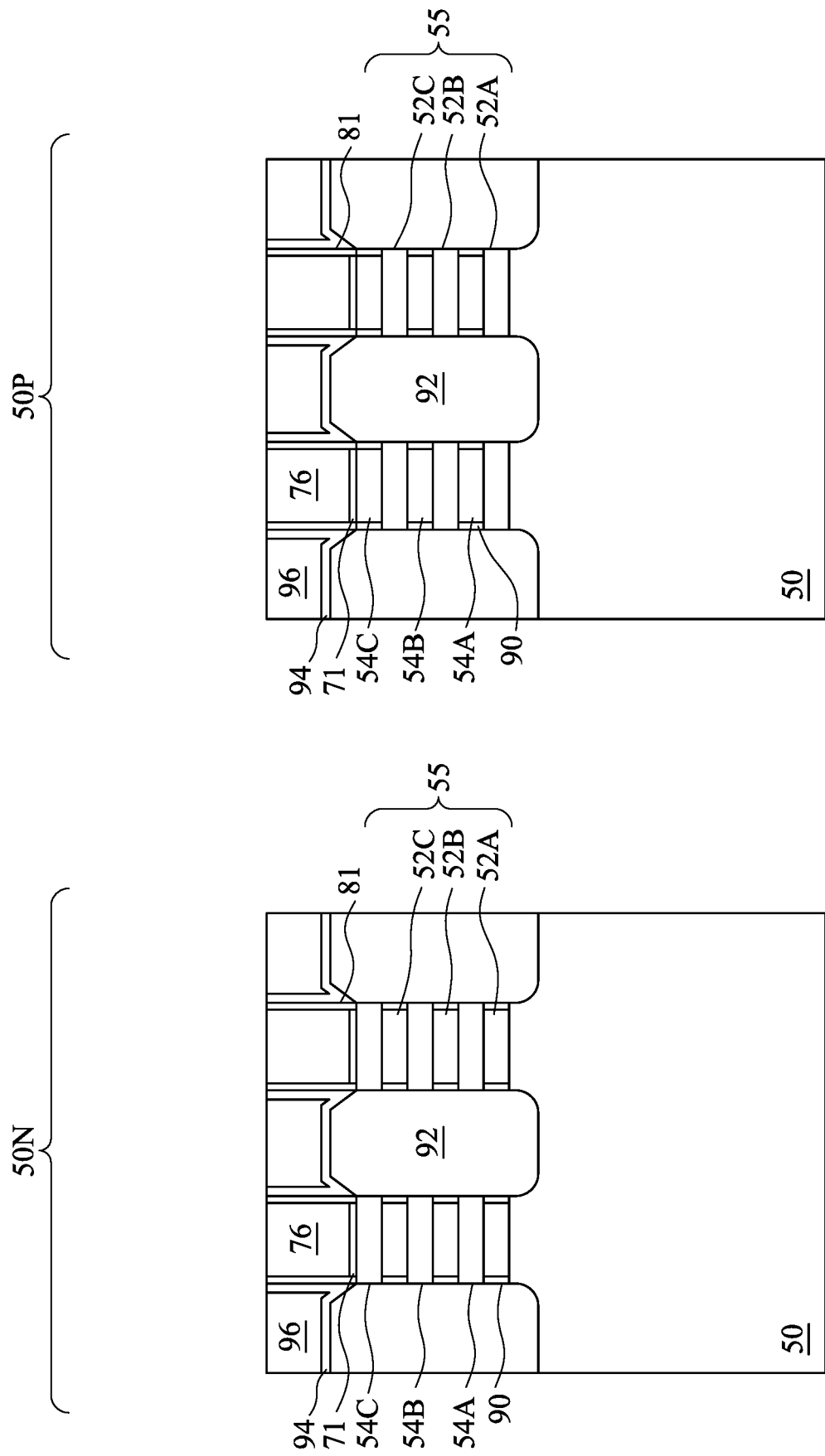

In FIGS. 15A-15C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gate layer 72 are exposed through the first ILD 96. In some embodiments, the masks 78 may remain, in which case the planarization process levels the top surface of the first ILD 96 with top surface of the masks 78 and the first spacers 81.

Figure 16A:
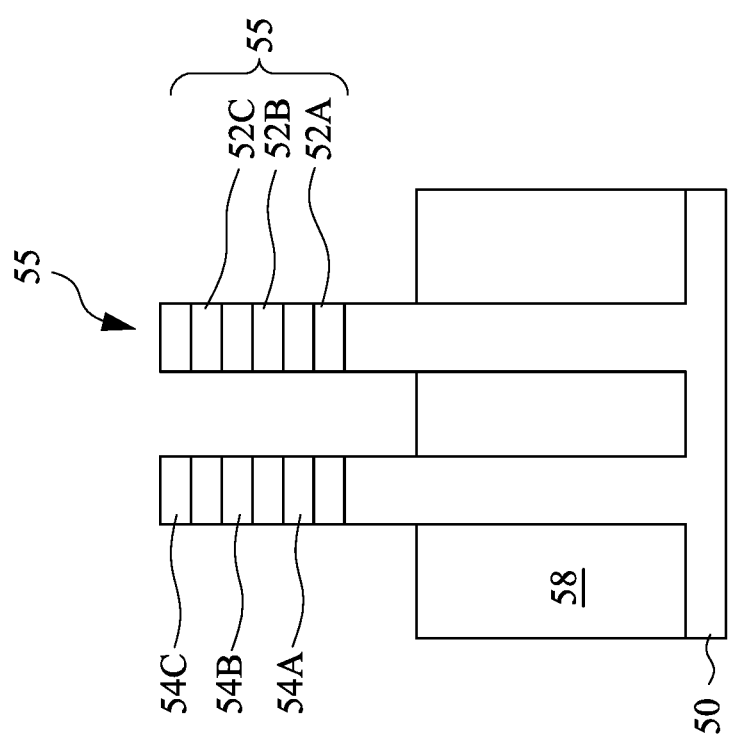
Figure 16B:
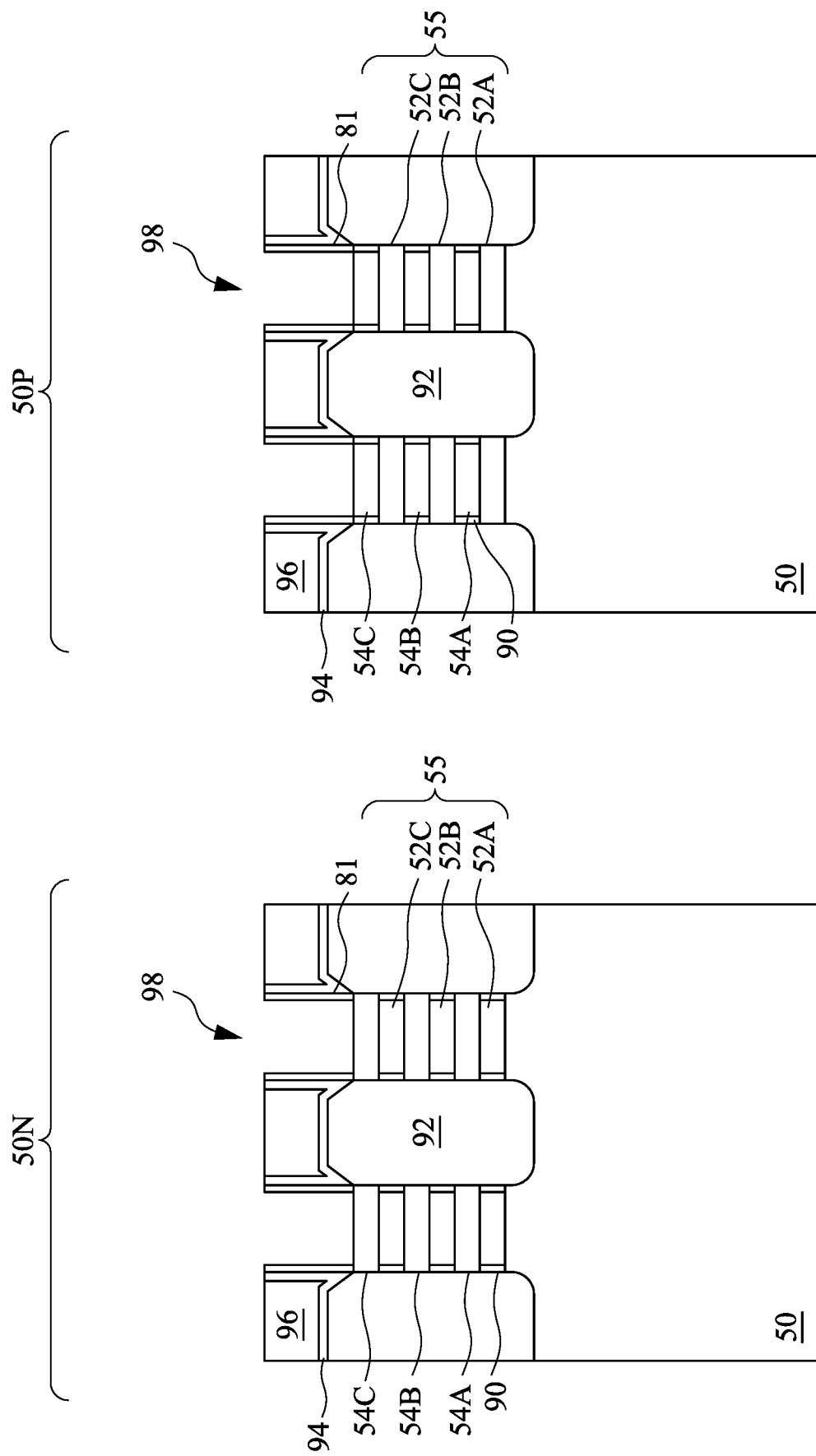

In FIGS. 16A and 16B, the dummy gate layer 72, and the masks 74 if present, are removed in one or more etching steps, so that second recesses 98 are formed. Portions of the dummy gate dielectrics 60 in the second recesses 98 are also be removed. In some embodiments, the dummy gate layer 72 and the dummy gate dielectrics 60 are removed by an anisotropic dry etch process. For example, the etching process may include a dry etch process using reaction gas(es) that selectively etch the dummy gate layer 72 at a faster rate than the first ILD 96 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy gate dielectrics 60 may be used as etch stop layers when the dummy gate layer 72 are etched. The dummy gate dielectrics 60 may then be removed after the removal of the dummy gate layer 72.

In FIGS. 17A and 17B, the first nanostructures 52 in the n-type region 50N and the second nanostructures 54 in the p-type region 50P are removed extending the second recesses 98. The first nanostructures 52 may be removed by forming a mask (not shown) over the p-type region 50P and performing an isotropic etching process such as wet etching or the like using etchants which are selective to the materials of the first nanostructures 52, while the second nanostructures 54, the substrate 50, the STI regions 58 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide ($NH_4OH$), or the like may be used to remove the first nanostructures 52 in the n-type region 50N.

The second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the STI regions 58 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based etchant, or the like may be used to remove the second nanostructures 54 in the p-type region 50P.

In FIGS. 18A and 18B, gate dielectric layers 100 and gate electrodes 102 are formed for replacement gates. The gate dielectric layers 100 are deposited conformally in the second recesses 98. In the n-type region 50N, the gate dielectric layers 100 may be formed on top surfaces and sidewalls of the substrate 50 and on top surfaces, sidewalls, and bottom surfaces of the second nanostructures 54, and in the p-type region 50P, the gate dielectric layers 100 may be formed on top surfaces and sidewalls of the substrate 50 and on top surfaces, sidewalls, and bottom surfaces of the first nanostructures 52. The gate dielectric layers 100 may also be deposited on top surfaces of the first ILD 96, the CESL 94, the first spacers 81, and the STI regions 58.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 18A and 18B, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 19B:
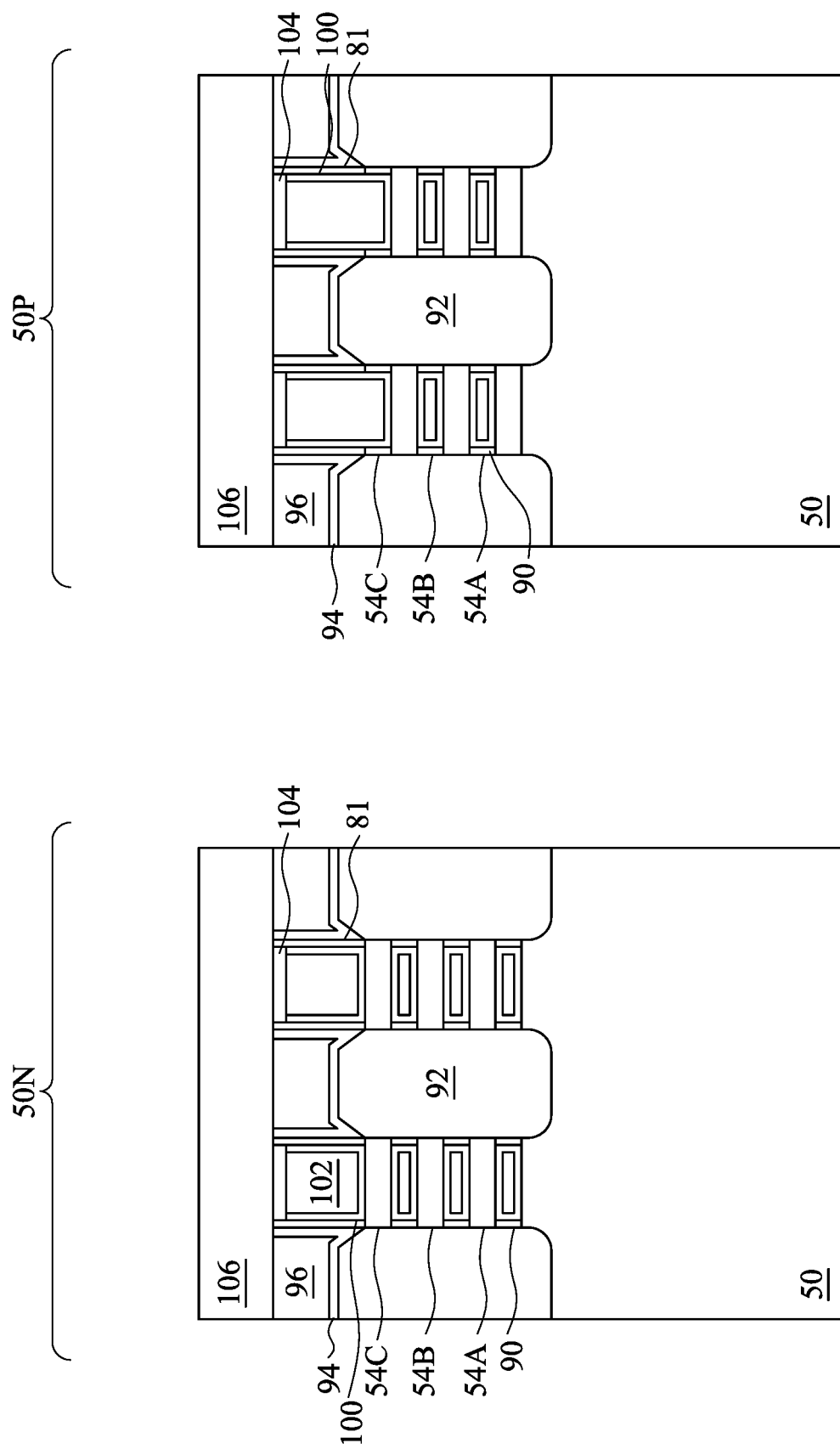
Figure 19C:
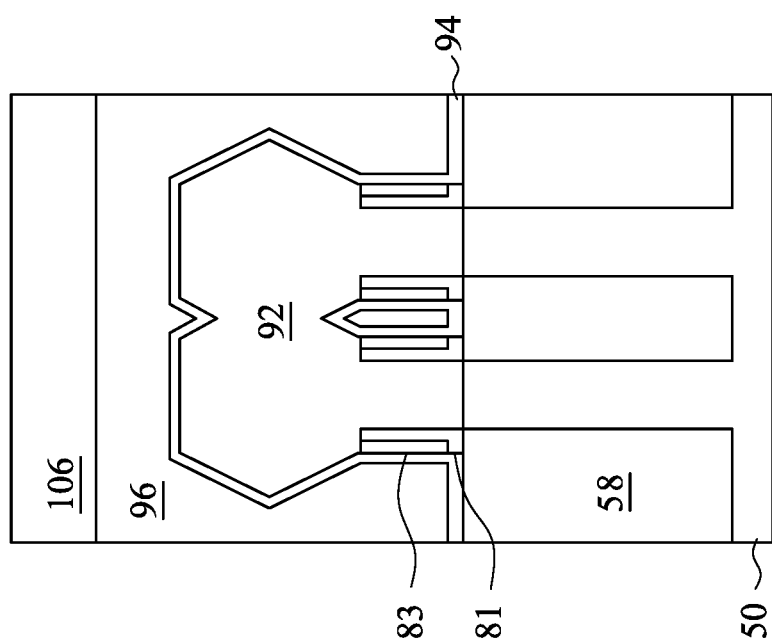

In FIGS. 19A-19C, the gate structure (including the gate dielectric layers 100 and the corresponding overlying gate electrodes 102) is recessed, so that a recess is formed directly over the gate structure and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 21A and 21B) penetrate through the gate mask 104 to contact the top surface of the recessed gate electrodes 102.

Figure 20C:
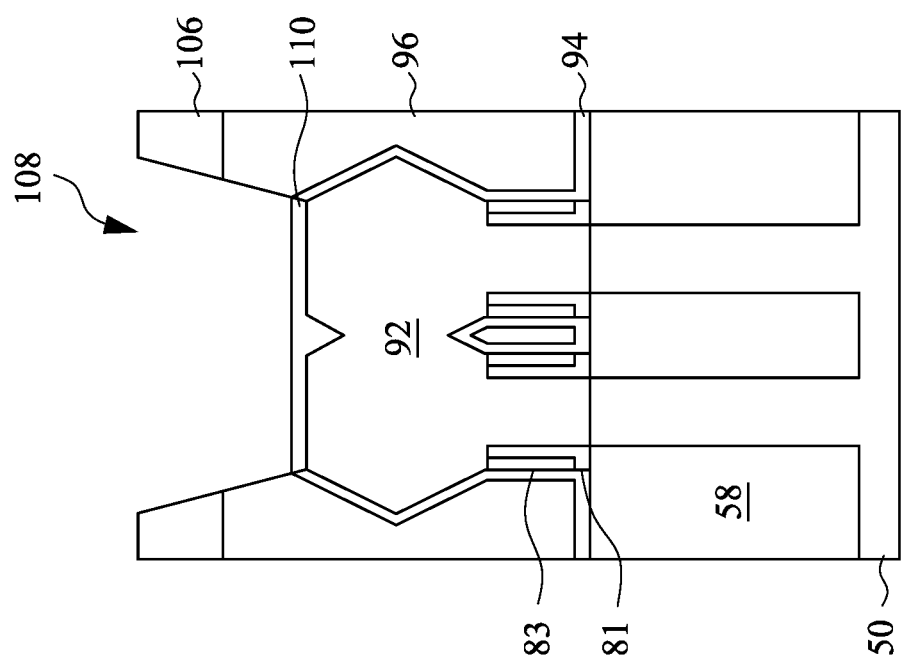

As further illustrated by FIGS. 20A-20C, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

In FIGS. 20A-20C, the second ILD 106, the first ILD 96, the CESL 94, and the gate masks 104 are etched to form third recesses 108 exposing surfaces of the epitaxial source/drain regions 92 and/or the gate structure. The third recesses 108 may be formed by etching using an anisotropic etching process, such as RIE, NBE, or the like. In some embodiments, the third recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/drain regions 92 and/or the gate structure, and a bottom of the third recesses 108 may be level with (e.g., at a same level, or having a same distance from the substrate), or lower than (e.g., closer to the substrate) the epitaxial source/drain regions 92 and/or the gate structure. Although FIG. 20B illustrate the third recesses 108 as exposing the epitaxial source/drain regions 92 and the gate structure in a same cross section, in various embodiments, the epitaxial source/drain regions 92 and the gate structure may be exposed in different cross-sections, thereby reducing the risk of shorting subsequently formed contacts. After the third recesses 108 are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although silicide regions 110 are referred to as silicide regions, silicide regions 110 may also be germanide regions, or silicon germanide regions (e.g., regions comprising silicide and germanide). In an embodiment, the silicide region 110 comprises TiSi, and has a thickness in a range between about 2 nm and about 10 nm.

Figure 21B:
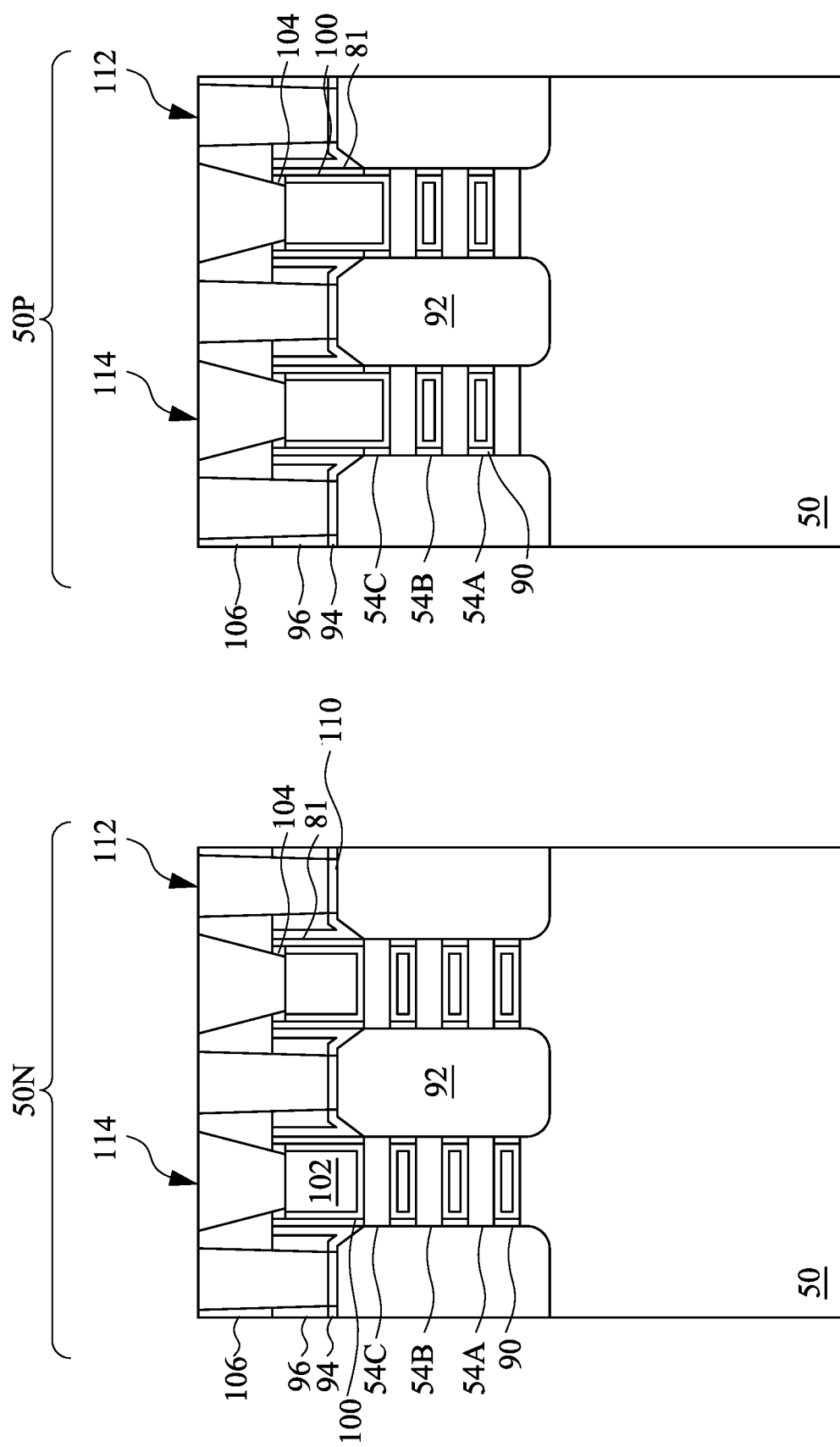
Figure 21C:
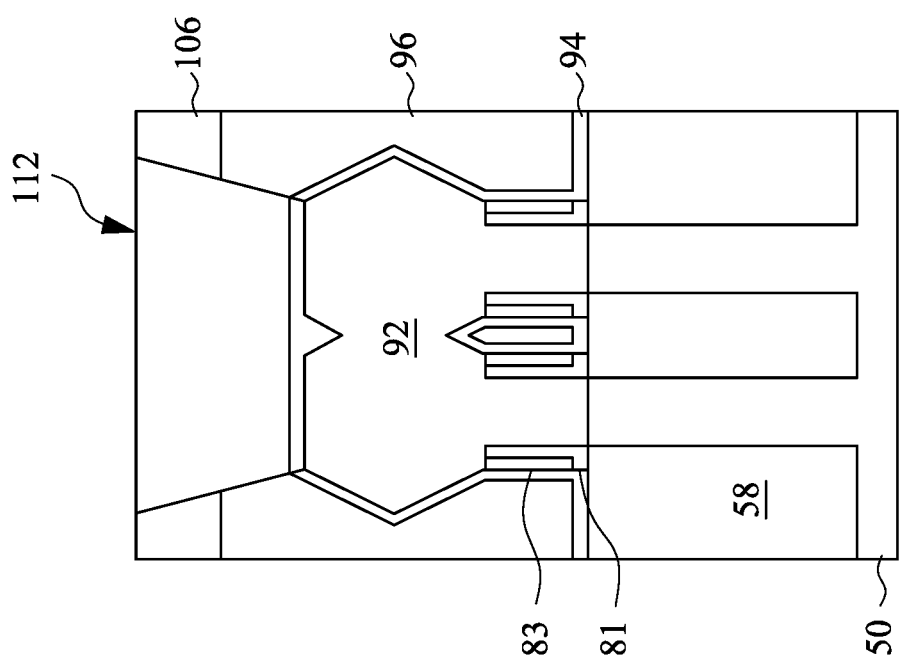

Next, in FIGS. 21A-C, contacts 112 and 114 (may also be referred to as contact plugs) are formed in the third recesses 108. The contacts 112 and 114 may each comprise one or more layers, such as barrier layers, diffusion layers, and fill materials. For example, in some embodiments, the contacts 112 and 114 each include a barrier layer and a conductive material, and is electrically coupled to the underlying conductive feature (e.g., gate electrodes 102 and/or silicide region 110 in the illustrated embodiment). The gate contacts 114 are electrically coupled to the gate electrode 102 and may be referred to as gate contacts, and the contacts 112 are electrically coupled to the silicide regions 110 and may be referred to as source/drain contacts. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106.

Embodiments may achieve advantages. For example, in embodiments in which the inner spacer material is formed and then converted using the annealing process in order to expand the material and seal any seams or voids in the material, subsequent etching processes more evenly etch the materials, leading to fewer defects during the etching processes. Such reduction in defects helps to improve yields and further allow for the reduction in size of the devices.

In an embodiment, a method of manufacturing a semiconductor device includes: providing a semiconductor structure comprising alternately stacked first semiconductor layers and second semiconductor layers; recessing the first semiconductor layers horizontally; forming a first inner spacer on the recessed surfaces of the first semiconductor layers and sidewalls of the second semiconductor layers; and performing an annealing process to the first inner spacer to form a second inner spacer, the second inner spacer having a larger oxygen content than the first inner spacer. In an embodiment an oxygen content of the second inner spacer ranges from 10% to 50%, and a nitride content of the second inner spacer ranges from 5% to 50%. In an embodiment an oxygen content of the second inner spacer ranges from 30% to 50%. In an embodiment a nitride content of the second inner spacer ranges from 20% to 50%. In an embodiment the performing the annealing process closes a seam within the first inner spacer. In an embodiment the forming the first inner spacer is performed at least in part with an atomic layer deposition process. In an embodiment the atomic layer deposition process utilizes ammonia as a first precursor and uses trichloro[(trichlorosilyl)methyl]silane as a second precursor.

In another embodiment, a method of manufacturing a semiconductor device includes: depositing a stack of layers, wherein the stack of layers comprises alternating layers of a first semiconductor material and a second semiconductor material; patterning a fin from the stack of layers; etching the first semiconductor material within the fin to form a first recess; filling at least a portion of the first recess with a first dielectric material, the first dielectric material comprising a seam after the filling at least the portion of the first recess; and closing the seam within the first recess by changing at least a portion of the first dielectric material to a second dielectric material. In an embodiment the closing the seam further comprising annealing the first dielectric material. In an embodiment the first dielectric material comprises silicon carbon nitride. In an embodiment the closing the seam adds oxygen to the first dielectric material. In an embodiment after the closing the seam the second dielectric material comprises an oxygen concentration between about 10% and about 50%. In an embodiment after the closing the seam the second dielectric material comprises a nitrogen concentration between about 5% and about 50%. In an embodiment the method further includes etching the second dielectric material to form inner spacers.

In yet another embodiment, a semiconductor device includes: a first nanostructure surrounded by a gate dielectric; a second nanostructure over the first nanostructure, wherein the second nanostructure is surrounded by the gate dielectric; and an inner spacer located between the first nanostructure and the second nanostructure, the inner spacer having a dished surface, the dished surface having a depth of less than about 4.3 nm. In an embodiment the depth is about 3.2 nm. In an embodiment the inner spacer is free from seams between the first nanostructure and the second nanostructure. In an embodiment the inner spacer comprises SiOCN. In an embodiment an oxygen content of the inner spacer ranges from 10% to 50%. In an embodiment an oxygen content of the inner spacer ranges from 30% to 50%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   providing a semiconductor structure comprising alternately stacked first semiconductor layers and second semiconductor layers;
   recessing the first semiconductor layers horizontally;
   forming a first inner spacer on the recessed surfaces of the first semiconductor layers and sidewalls of the second semiconductor layers; and
   performing an annealing process to the first inner spacer to form a second inner spacer, the second inner spacer having a larger oxygen content than the first inner spacer.

2. The method of claim 1, wherein an oxygen content of the second inner spacer ranges from 10% to 50%, and a nitride content of the second inner spacer ranges from 5% to 50%.

3. The method of claim 1, wherein an oxygen content of the second inner spacer ranges from 30% to 50%.

4. The method of claim 1, wherein a nitride content of the second inner spacer ranges from 20% to 50%.

5. The method of claim 1, wherein the performing the annealing process closes a seam within the first inner spacer.

6. The method of claim 1, wherein the forming the first inner spacer is performed at least in part with an atomic layer deposition process.

7. The method of claim 6, wherein the atomic layer deposition process utilizes ammonia as a first precursor and uses trichloro[(trichlorosilyl)methyl]silane as a second precursor.

8. A method of manufacturing a semiconductor device, the method comprising:
   depositing a stack of layers, wherein the stack of layers comprises alternating layers of a first semiconductor material and a second semiconductor material;
   patterning a fin from the stack of layers;
   etching the first semiconductor material within the fin to form a first recess;
   filling at least a portion of the first recess with a first dielectric material, the first dielectric material comprising a seam after the filling at least the portion of the first recess; and
   closing the seam within the first recess by changing at least a portion of the first dielectric material to a second dielectric material.

9. The method of claim 8, wherein the closing the seam further comprising annealing the first dielectric material.

10. The method of claim 9, wherein the first dielectric material comprises silicon carbon nitride.

11. The method of claim 10, wherein the closing the seam adds oxygen to the first dielectric material.

12. The method of claim 11, wherein after the closing the seam the second dielectric material comprises an oxygen concentration between about 10% and about 50%.

13. The method of claim 12, wherein after the closing the seam the second dielectric material comprises a nitrogen concentration between about 5% and about 50%.

14. The method of claim 8, further comprising etching the second dielectric material to form inner spacers.

15. A semiconductor device comprising:
a first nanostructure surrounded by a gate dielectric;
a second nanostructure over the first nanostructure, wherein the second nanostructure has a substantially constant thickness and is surrounded by the gate dielectric; and
an inner spacer located between the first nanostructure and the second nanostructure, the inner spacer having a dished surface, the dished surface having a depth of less than about 4.3 nm.

16. The semiconductor device of claim 15, wherein the depth is about 3.2 nm.

17. The semiconductor device of claim 15, wherein the inner spacer is free from seams between the first nanostructure and the second nanostructure.

18. The semiconductor device of claim 15, wherein the inner spacer comprises SiOCN, wherein the inner spacer has an oxide rich region and an oxide less region, a concentration gradient of oxygen extending from the oxide rich region to the oxide less region.

19. The semiconductor device of claim 15, wherein an oxygen content of the inner spacer ranges from 10% to 50%.

20. The semiconductor device of claim 15, wherein an oxygen content of the inner spacer ranges from 30% to 50%.

* * * * *